US008823575B2

(12) United States Patent
Hagihara

(10) Patent No.: US 8,823,575 B2
(45) Date of Patent: Sep. 2, 2014

(54) AD CONVERSION CIRCUIT AND SOLID-STATE IMAGE PICKUP DEVICE

(71) Applicant: Olympus Corporation, Tokyo (JP)

(72) Inventor: Yoshio Hagihara, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 14/037,842

(22) Filed: Sep. 26, 2013

(65) Prior Publication Data
US 2014/0098271 A1 Apr. 10, 2014

(30) Foreign Application Priority Data

Oct. 4, 2012 (JP) ................................. 2012-222044

(51) Int. Cl.
H03M 1/56 (2006.01)
H03M 1/34 (2006.01)
H04N 5/3745 (2011.01)

(52) U.S. Cl.
CPC ............. *H04N 5/37455* (2013.01); *H03M 1/34* (2013.01)
USPC ............ 341/169; 341/155; 341/145; 341/158

(58) Field of Classification Search
CPC .... H03M 1/34; H04N 5/3745; H04N 5/37455
USPC ........... 341/169, 155, 145, 158; 348/308, 302
See application file for complete search history.

(56) References Cited

U.S. PATENT DOCUMENTS

| 7,859,583 B2 * | 12/2010 | Kawaguchi ................... 348/308 |
| 2009/0040352 A1 * | 2/2009 | Kawaguchi ................... 348/308 |
| 2009/0201187 A1 * | 8/2009 | Asayama et al. ............ 341/145 |
| 2010/0194949 A1 * | 8/2010 | Hisamatsu ................... 348/302 |
| 2010/0271519 A1 * | 10/2010 | Ui et al. ........................ 348/302 |
| 2011/0186713 A1 * | 8/2011 | Hagihara ................... 250/208.1 |
| 2011/0292265 A1 * | 12/2011 | Takahashi et al. ............ 348/308 |
| 2012/0104233 A1 * | 5/2012 | Mori et al. ................. 250/208.1 |

FOREIGN PATENT DOCUMENTS

| JP | 2006-340044 A | 12/2006 |
| JP | 2008-092091 A | 4/2008 |
| JP | 2012-039386 A | 2/2012 |

* cited by examiner

Primary Examiner — Jean B Jeanglaude
(74) Attorney, Agent, or Firm — Westerman, Hattori, Daniels & Adrian, LLP

(57) ABSTRACT

An AD conversion circuit may include: a reference signal generation unit generating a reference signal increasing or decreasing with passage of time; a comparison unit including a first comparison circuit and a second comparison circuit comparing an analog signal to be subjected to an AD conversion with the reference signal; a clock generation unit including a delay circuit in which a plurality of delay units are connected to one another, and outputting a first lower phase signal and a second lower phase signal based on clock signals output from each of the plurality of delay units; a latch unit including a first latch circuit latching a logical state of the first lower phase signal and a second latch circuit latching a logical state of the second lower phase signal; and a counting unit performing counting based on the second lower phase signal output from the clock generation unit.

14 Claims, 18 Drawing Sheets

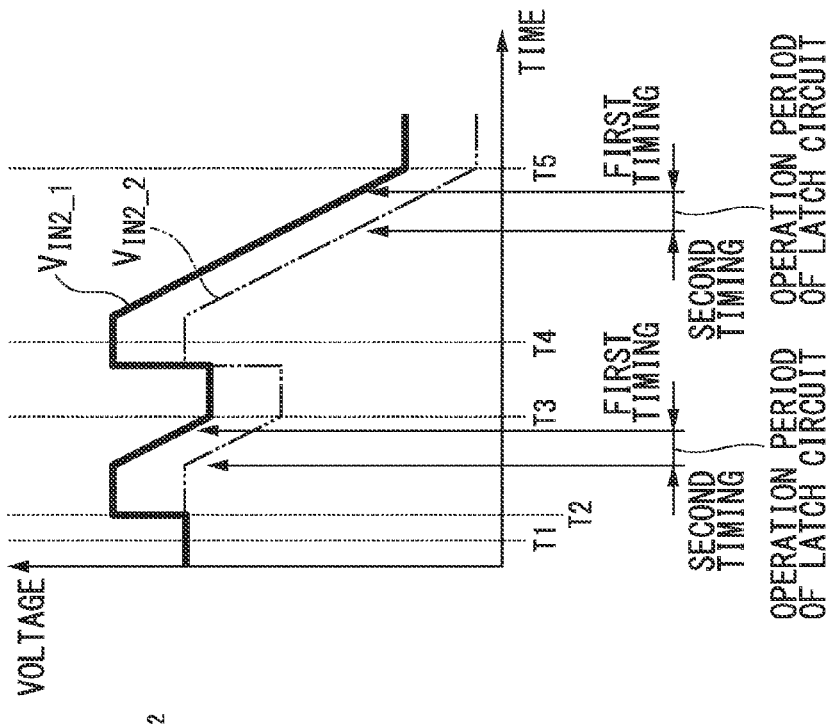
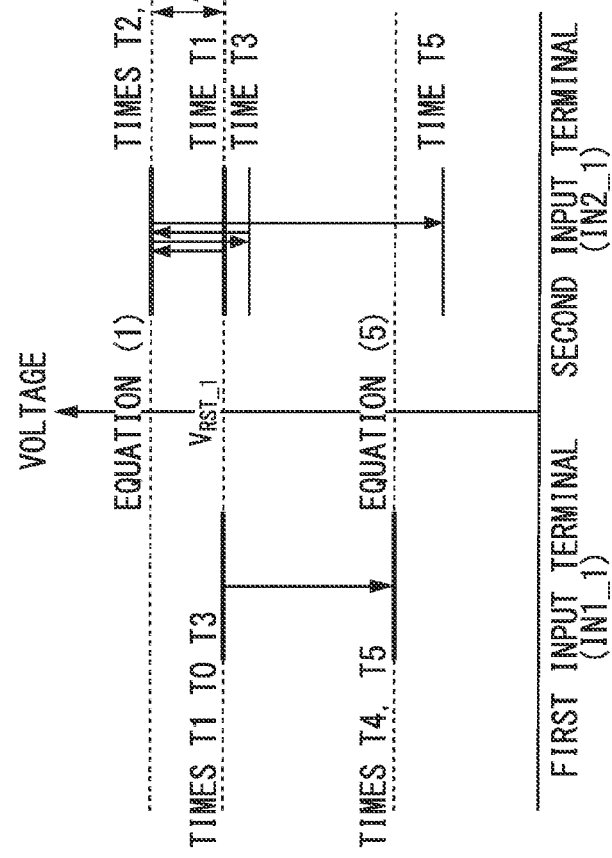
FIG. 6A
FIG. 6B

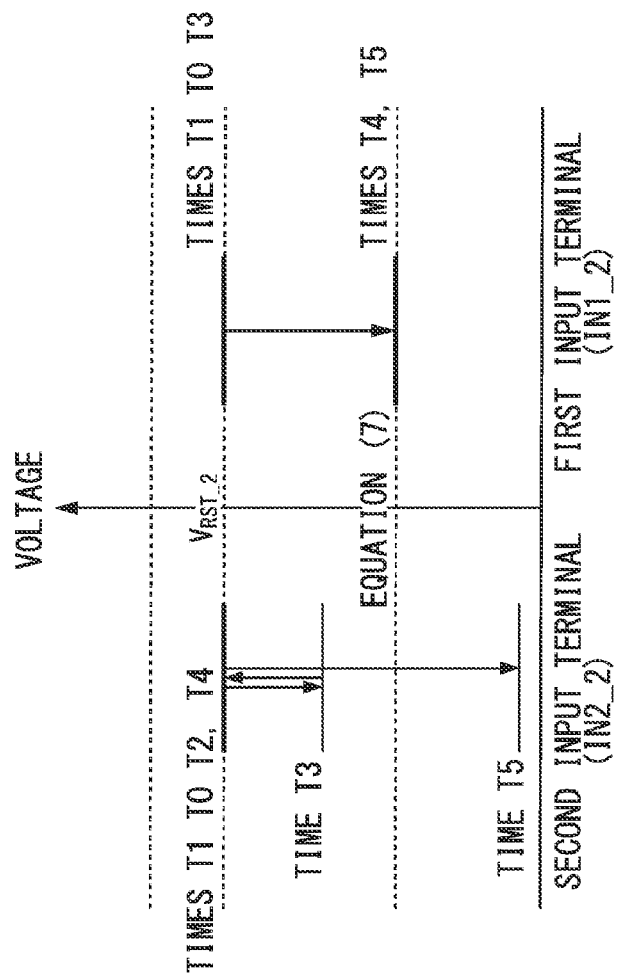
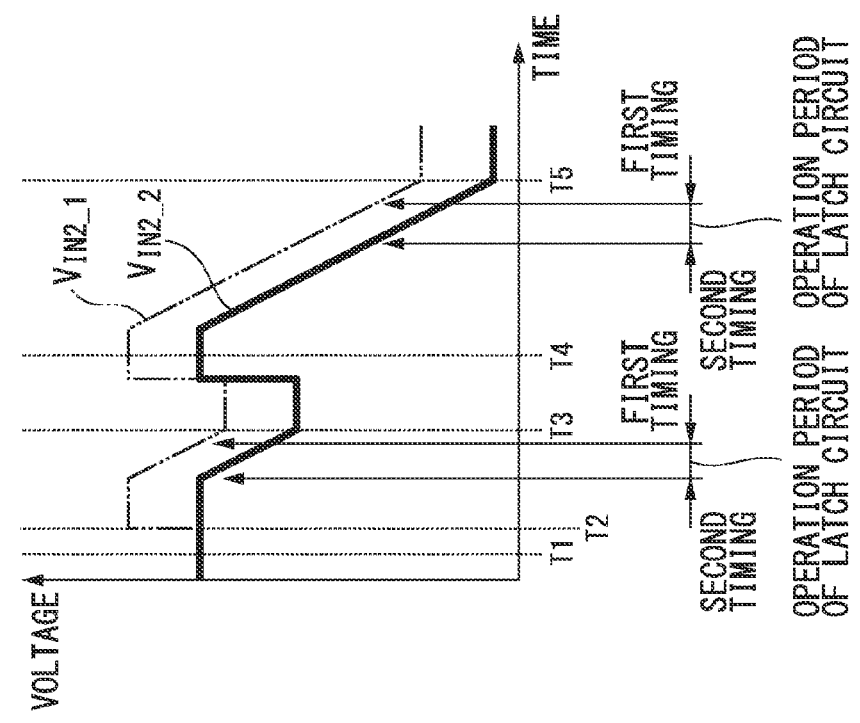

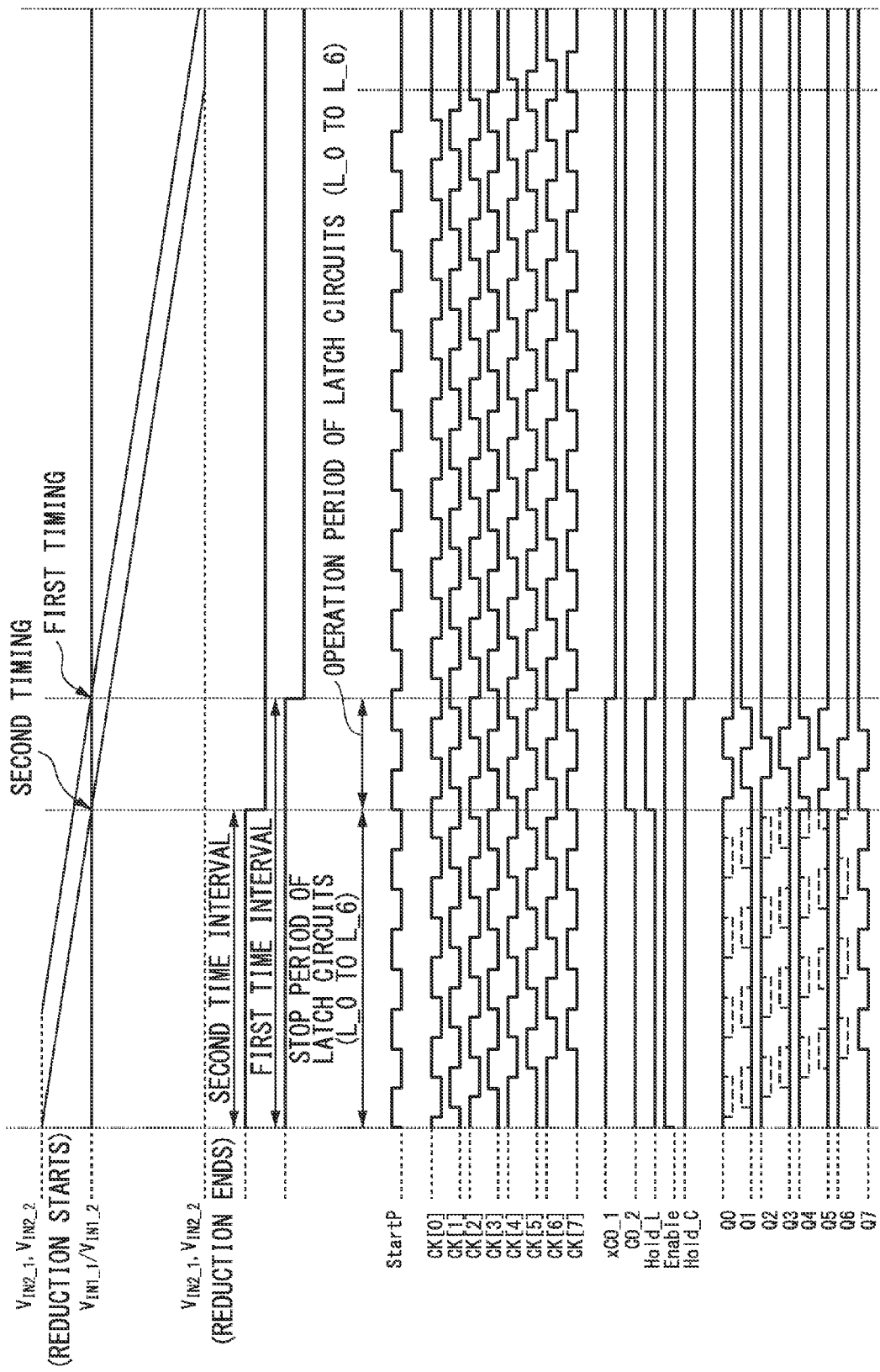

AD CONVERSION CIRCUIT AND SOLID-STATE IMAGE PICKUP DEVICE

BACKGROUND OF THE INVENTION

1. Field of the Invention

The present invention relates to an AD conversion circuit and a solid-state image pickup device including the AD conversion circuit.

Priority is claimed on Japanese Patent Application No. 2012-222044, filed Oct. 4, 2012, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

As an example of a solid-state image pickup device using a tdcSS (=time to digital converter Single Slope) type AD conversion circuit obtained by combining a TDC (=Time to Digital Converter) type AD conversion circuit with an SS (=Single Slope) type AD conversion circuit (for example, refer to Japanese Unexamined Patent Application, First Publication No. 2006-340044), a configuration disclosed in Japanese Unexamined Patent Application, First Publication No. 2008-92091 has been known. FIG. 18 illustrates the configuration of the tdcSS type AD conversion circuit in accordance with the related art. First, the configuration and the operation of the tdcSS type AD conversion circuit of FIG. 18 will be described.

The tdcSS type AD conversion circuit illustrated in FIG. 18 includes a clock generation unit 1030, a comparison unit 1031, a latch unit 1033, a counting unit 1034, and a reference signal generation unit 1035. The clock generation unit 1030 has a delay circuit including 8 delay units DU[0] to DU[7]. The comparison unit 1031 has a comparison circuit CMP that compares an analog signal Signal to be subjected to AD conversion with a ramp wave Ramp that decreases with the passage of time. In the comparison unit 1031, a time interval (the magnitude in a time axis direction) corresponding to the magnitude of the analog signal Signal is generated.

The latch unit 1033 has latch circuits L_0 to L_7 that latch the logical states of output clocks CK[0] to CK[7] of the delay units DU[0] to DU[7] constituting the clock generation unit 1030. The counting unit 1034 has a counter circuit CNT that counts the output clock CK[7], which is output through the latch circuit L_7 of the latch unit 1033, as a counting clock. A control signal RST input to the counting unit 1034 is a signal for resetting the counter circuit CNT. The reference signal generation unit 1035 generates the ramp wave Ramp that is a reference signal. Comparison output C0 of the comparison unit 1031 is input to a buffer circuit BUF2. The buffer circuit BUF2 is an inversion buffer circuit that inverts the comparison output C0 of the comparison unit 1031 and outputs a control signal Hold.

The latch circuits L_0 to L_7 constituting the latch unit 1033 are in an enable (valid, active) state when the control signal Hold output from the buffer circuit BUF2 is High, and output the output clocks CK[0] to CK[7] of the delay units DU[0] to DU[7] without change. Furthermore, the latch circuits L_0 to L_7 enter a disable (invalid, holding) state when the control signal Hold is transitioned from High to Low, and latch logical states corresponding to the output clocks CK[0] to CK[7] of the delay units DU[0] to DU[7] at that time.

Next, an operation of the related art will be described. FIG. 19 illustrates the operation of the A/D conversion circuit in accordance with the related art.

First, at a timing according to the comparison start in the comparison unit 1031, as a start pulse (=StartP), a clock of a cycle which approximately coincides with the delay time (the sum of delay times of the 8 delay units DU[0] to DU[7]) of the clock generation unit 1030 is input to the clock generation unit 1030. In this way, the delay units DU[0] to DU[7] of the clock generation unit 1030 start to operate. The delay unit DU[0] constituting the clock generation unit 1030 delays the start pulse StartP and outputs the output clock CK[0], and the delay units DU[1] to DU[7] constituting the clock generation unit 1030 delay output signals of delay units of a previous stage and output the output clocks CK[1] to CK[7], respectively. The output clocks CK[0] to CK[7] of the delay units DU[0] to DU[7] are input to the latch circuits L_0 to L_7 of the latch unit 1033. The latch circuit L_7 outputs the received output clock CK[7] of the delay unit DU[7] to the counting unit 1034 without change.

The counting unit 1034 performs a counting operation based on the output clock CK[7]. In this counting operation, a count value increases or decreases with the rise or fall of the output clock CK[7]. At a timing (a second timing) at which the analog signal Signal approximately coincides with the ramp wave Ramp, the comparison output C0 of the comparison unit 1031 is inverted. Moreover, at a timing (a first timing) after the comparison output C0 is buffered in the buffer circuit BUF2, the control signal Hold is Low.

In this way, the latch circuits L_0 to L_7 of the latch unit 1033 enter a disable (holding) state. At this time, logical states corresponding to the output clocks CK[0] to CK[7] of the delay units DU[0] to DU[7] are latched in the latch circuits L_0 to L_7. The counting unit 1034 latches a count value when the latch circuit L_7 stops operating. According to the logical state latched in the latch unit 1033 and the count value latched in the counting unit 1034, digital data corresponding to the analog signal Signal is obtained.

According to Japanese Unexamined Patent Application, First Publication No. 2012-39386, a latch control unit is provided to control the operation of the latch unit 1033, to allow the latch circuits L_0 to L_6 of the latch unit 1033 to be in an enable (active) state at the second timing, and to allow the latch circuits L_0 to L_7 of the latch unit 1033 to be in a disable (hold) state at the first timing, thereby shortening the operation period of the latch circuits L_0 to L_6 of the latch unit 1033, resulting in the achievement of low current consumption of the tdcSS type AD conversion circuit. The latch control unit has an inversion delay circuit that inverts and delays the comparison output C0 of the comparison unit 1031 in order to generate the time difference between the second timing and the first timing.

In the conventional tdcSS type AD conversion circuit and a solid-state image pickup device using the same, AD conversion accuracy is likely to deteriorate due to bounce of power and ground.

In a column circuit provided in the image pickup device using the conventional tdcSS type AD conversion circuit, the comparison unit 1031, the latch unit 1033, and the counting unit 1034 are arranged for each column in correspondence with each column of pixels arranged in a matrix form. A power supply voltage VDD is supplied to each part of the column circuit. However, the closer a column is to the center (that is, the farther it is from the power), compared to a column at the end of the column circuit, since wiring resistance becomes larger, the larger voltage drop occurs, resulting in the reduction of the power supply voltage VDD. Furthermore, as a current consumed in the circuit becomes large, voltage drop becomes larger. For the same reason, the closer a column is to the center (that is, the farther it is from the ground), compared to a column at the end of the column circuit, the more the ground voltage GND increases. For example, in a column at the end of the column circuit, even when the power supply voltage VDD is 1.5 [V] and the ground voltage GND is 0 [V], there is a case in which the power supply voltage VDD is about 1.2 [V] and the ground voltage GND is about 0.3 [V] in the center column of the column circuit.

During an AD conversion period (for example, during an AD conversion period of a reset level that is approximately constant in all pixels), since the comparison outputs C0 of the comparison units 1031 of all columns are inverted almost at the same time, there is a case in which the latch control unit and the latch circuits L__0 to L__6 start to operate almost at the same time (enter an enable state). In this case, since a transient current flows through the latch control units and the latch circuits L__0 to L__6 of all columns, transient bounce (ringing of a transient voltage about the power supply voltage VDD of 1.2 [V] and the ground voltage GND of 0.3 [V]) of power and ground occurs in the vicinity of the center column of the column circuit due to the transient current and the wiring resistance.

In the conventional tdcSS type AD conversion circuit, at the timing after a delay time in the inversion delay circuit of the latch control unit from the timing at which the latch circuits L__0 to L__6 have started to operate almost at the same time, the latch circuits L__0 to L__6 enter a disable state to latch logical states of input signals. However, in the vicinity of the center column of the column circuit, since the delay time of the inversion delay circuit of the latch control unit varies in response to the power supply and ground voltages (the magnitude of bounce) and thus a latch timing varies, the latch circuits L__0 to L__6 are likely unable to precisely latch the logical states of the input signals. This event may occur frequently when the comparison output C0 of a plurality of comparison units 1031 are changed almost at the same time, so that the AD conversion accuracy is likely to deteriorate.

SUMMARY

According to a first aspect of the present invention, an AD conversion circuit may include: a reference signal generation unit configured to generate a reference signal increasing or decreasing with passage of time; a comparison unit that includes a first comparison circuit and a second comparison circuit, each of which compares an analog signal to be subjected to an AD conversion with the reference signal; a clock generation unit that includes a delay circuit in which a plurality of delay units are connected to one another, the clock generation unit outputting a first lower phase signal and a second lower phase signal based on clock signals that are output from each of the plurality of delay units; a latch unit that includes a first latch circuit and a second latch circuit, the first latch circuit being configured to latch a logical state of the first lower phase signal that is output from the clock generation unit, the second latch circuit being configured to latch a logical state of the second lower phase signal that is output from the clock generation unit; and a counting unit configured to perform counting based on the second lower phase signal that is output from the clock generation unit. The first comparison circuit may be configured to complete a first comparison process at a first timing at which the reference signal satisfies a predetermined condition with respect to the analog signal. The second comparison circuit may be configured to determine a second timing corresponding to a magnitude of the analog signal. The first timing may be later than the second timing. The latch unit may be configured to make the second latch circuit, to which the second lower phase signal is input, valid, and then make the first latch circuit, to which the first lower phase signal is input, valid at a timing according to the second timing. The latch unit may be configured to latch the first lower phase signal through the first latch circuit and the second lower phase signal through the second latch circuit at a timing according to the first timing.

According to a second aspect of the present invention, an AD conversion circuit may include: a reference signal generation unit configured to generate a reference signal increasing or decreasing with passage of time; a comparison unit that includes a first comparison circuit and a second comparison circuit, each of which compares an analog signal to be subjected to an AD conversion with the reference signal; a counting unit configured to perform a counting by using a clock signal with a predetermined frequency as a counting clock so as to generate a lower count value, the counting unit being configured to output a first lower phase signal including a first bit signal constituting the lower count value and a second lower phase signal including a second bit signal constituting the lower count value; and a latch unit that includes a first latch circuit that latches a logical state of the first lower phase signal that is output from the counting unit, and a second latch circuit that latches a logical state of the second lower phase signal. The first comparison circuit may be configured to complete a first comparison process at a first timing at which the reference signal satisfies a predetermined condition with respect to the analog signal. The second comparison circuit may be configured to decide a second timing corresponding to a magnitude of the analog signal. The first timing may be later than the second timing. The latch unit may be configured to make the second latch circuit, to which the second lower phase signal is input, valid, and then make the first latch circuit, to which the first lower phase signal is input, valid at a timing according to the second timing. The latch unit may be configured to latch the first lower phase signal through the first latch circuit and the second lower phase signal through the second latch circuit at a timing according to the first timing.

According to a third aspect of the present invention, the AD conversion circuit according to the second aspect may further include: a second counting unit configured to perform counting by using one bit signal, which constitutes the second lower phase signal that is output from the counting unit, as a counting clock.

According to a fourth aspect of the present invention, in the AD conversion circuit according to any one of the first, second and third aspects, the second timing may be a timing at which the reference signal satisfies a predetermined condition with respect to the analog signal.

According to a fifth aspect of the present invention, in the AD conversion circuit according to the fourth aspect, the first comparison circuit may be configured to apply an offset voltage to at least one of a first input terminal to which the analog signal is input and a second input terminal to which the reference signal is input, so as to make the first timing later than the second timing.

According to a sixth aspect of the present invention, in the AD conversion circuit according to the fourth aspect, the reference signal generation unit may be configured to generate a first reference signal and a second reference signal. The first comparison circuit may be configured to compare the analog signal with the first reference signal. The second comparison circuit may be configured to compare the analog signal with the second reference signal. The reference signal generation unit may be configured to make a timing, at which the first reference signal starts to be increased or decreased, later than a timing at which the second reference signal starts to be increased or decreased, so as to make the first timing later than the second timing.

According to a seventh aspect of the present invention, a solid-state image pickup device may include: an image capturing unit in which a plurality of pixels including a photoelectric conversion element are arranged in a matrix form to output a pixel signal; and the AD conversion circuit according to the first aspect or the second aspect, which receives an analog signal corresponding to the pixel signal. The comparison unit, the latch unit, and the counting unit included in the AD conversion circuit may be disposed for each one column or a plurality of columns of arrangement of the pixels of the image capturing unit.

BRIEF DESCRIPTION OF THE DRAWINGS

The above features and advantages of the present invention will be more apparent from the following description of certain preferred embodiments taken in conjunction with the accompanying drawings, in which:

FIG. 6A and FIG. 6B are reference diagrams illustrating a voltage change in input terminals of a main comparison circuit provided in an AD conversion circuit in accordance with the second preferred embodiment of the present invention;

FIG. 9A and FIG. 9B are reference diagrams illustrating a voltage change in input terminals of a sub-comparison circuit provided in an AD conversion circuit in accordance with the second preferred embodiment of the present invention;

FIG. 14 is a timing chart illustrating the operation of an AD conversion circuit in accordance with a fourth preferred embodiment of the present invention;

DETAILED DESCRIPTION OF THE PREFERRED EMBODIMENTS

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated for explanatory purpose.

First Preferred Embodiment

Figure 1:
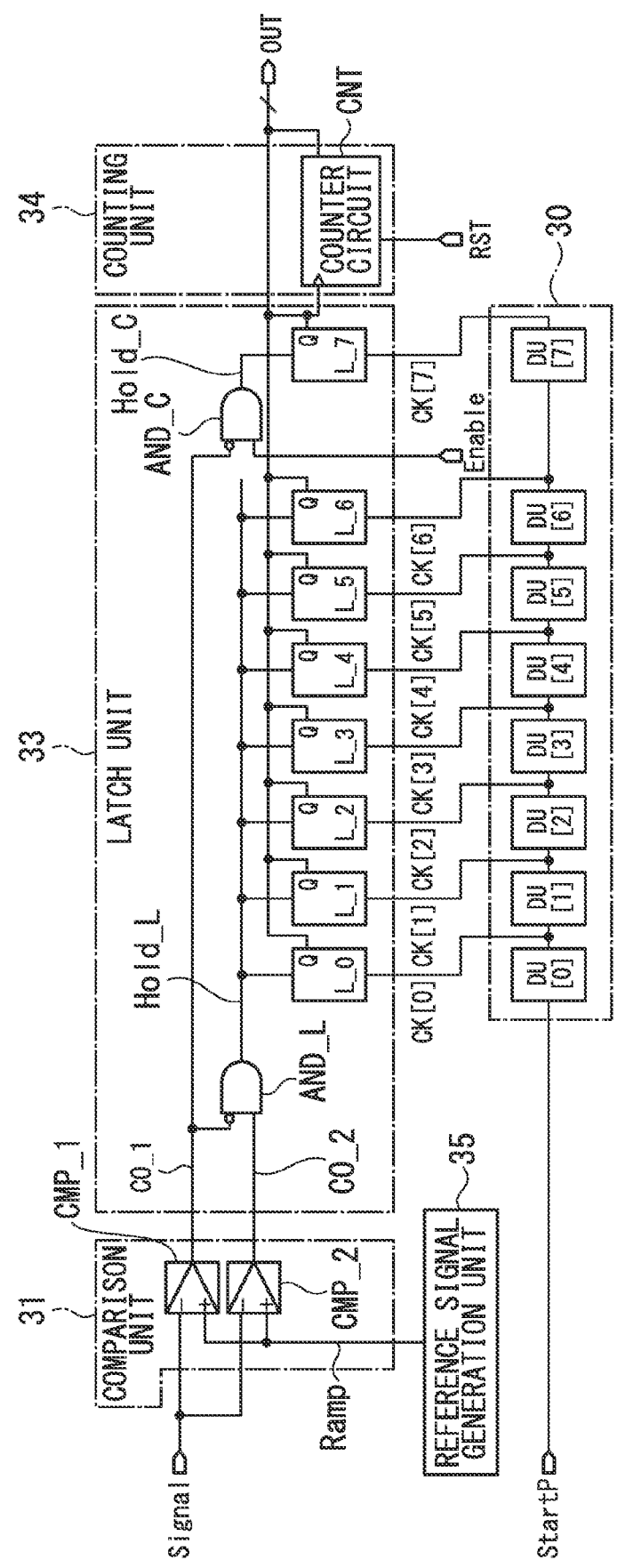
FIG. 1 is a circuit diagram illustrating the configuration of an AD conversion circuit in accordance with a first preferred embodiment of the present invention.

First, a first preferred embodiment of the present invention will be described. FIG. 1 illustrates the configuration of an AD conversion circuit in accordance with the first preferred embodiment. The AD conversion circuit illustrated in FIG. 1 includes a clock generation unit 30, a comparison unit 31, a latch unit 33, a counting unit 34, and a reference signal generation unit 35.

The clock generation unit 30 has a delay circuit including 8 delay units DU[0] to DU[7]. The comparison unit 31 has a main comparison circuit CMP_1 (a first comparison circuit) and a sub-comparison circuit CMP_2 (a second comparison circuit), which compare an analog signal Signal to be subjected to AD conversion with a ramp wave Ramp (a reference signal) that decreases with the passage of time. Comparison outputs C0_1 and C0_2 of the main comparison circuit CMP_1 and the sub-comparison circuit CMP_2, for example, are at a Low level (L level) when the voltage of the ramp wave Ramp is larger than the voltage of the analog signal Signal, and are at a High level (H level) when the voltage of the ramp wave Ramp is equal to or less than the voltage of the analog signal Signal.

The latch unit 33 has latch circuits L_0 to L_7 and AND circuits AND_L and AND_C. The latch circuits L_0 to L_7 latch the logical states of output clocks CK[0] to CK[7] of the delay units DU[0] to DU[7] constituting the clock generation unit 30. The AND circuit AND_L receives a signal obtained by inverting the comparison output C0_1 of the main comparison circuit CMP_1, and the comparison output C0_2 of the sub-comparison circuit CMP_2. The AND circuit AND_L outputs a control signal Hold_L obtained by performing an AND operation on the signal obtained by inverting the comparison output C0_1 of the main comparison circuit CMP_1 and the comparison output C0_2 of the sub-comparison circuit CMP_2. The AND circuit AND_C receives the signal obtained by inverting the comparison output C0_1 of the main comparison circuit CMP_1, and an enable signal Enable. The AND circuit AND_C outputs a control signal Hold_C obtained by performing an AND operation on the signal obtained by inverting comparison output C0_1 of the main comparison circuit CMP_1 and the enable signal Enable.

The counting unit 34 has a counter circuit CNT that counts the output clock CK[7], which is output through the latch circuit L_7 of the latch unit 33, as a counting clock. A control signal RST input to the counting unit 34 is a signal for resetting the counter circuit CNT. The reference signal generation unit 35 generates the ramp wave Ramp that is a reference signal.

The latch circuits L_0 to L_6 (a first latch circuit) of the latch unit 33 are in an enable state when the control signal Hold_L from the AND circuit AND_L is in an H state, and output the output clocks CK[0] to CK[6] (a first lower phase signal) from the clock generation unit 30 without change. Furthermore, the latch circuits L_0 to L_6 enter a disable state when the control signal Hold_L from the AND circuit AND_L is changed from an H state to an L state, and latch logical states corresponding to the output clocks CK[0] to CK[6] from the clock generation unit 30 at that time.

Meanwhile, the latch circuit L_7 (a second latch circuit) of the latch unit 33 is in an enable state when the control signal Hold_C from the AND circuit AND_C is in an H state, and outputs the output clock CK[7] (a second lower phase signal) from the clock generation unit 30 without change. Furthermore, the latch circuit L_7 enters a disable state when the control signal Hold_C from the AND circuit AND_C is changed from a High state (H state) to a Low state (L state), and latches a logical state corresponding to the output clock CK[7] from the clock generation unit 30 at that time. Furthermore, the present configuration is for illustrative purposes only, and the present invention is not limited thereto.

Next, a detailed operation of the first preferred embodiment will be described. Hereinafter, two types of operations will be described.

(First Operation)

Figure 2:
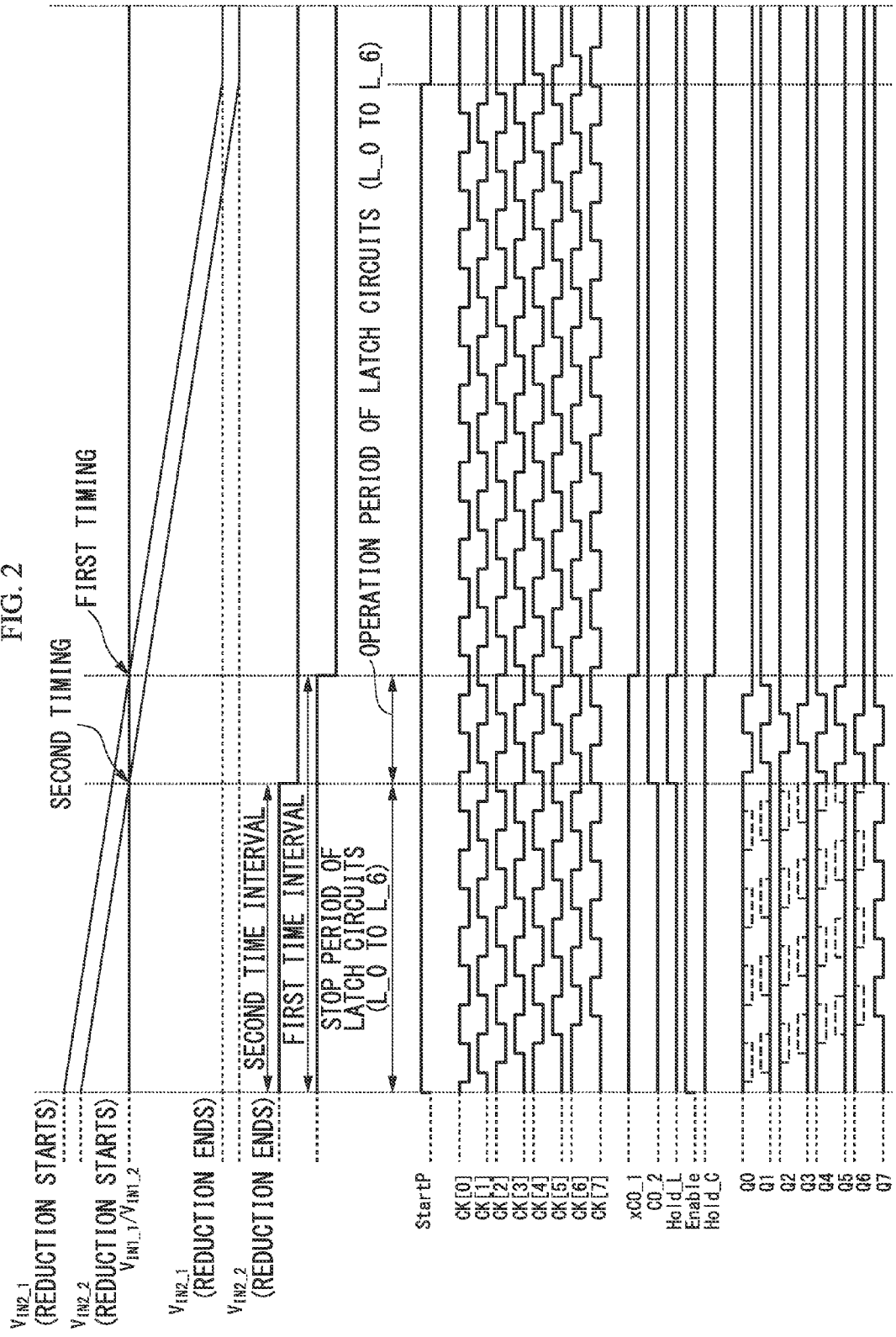
FIG. 2 is a timing chart illustrating the operation of an AD conversion circuit in accordance with the first preferred embodiment of the present invention.

First, a first operation will be described. FIG. 2 illustrates the first operation of the AD conversion circuit in accordance with the first preferred embodiment. In FIG. 2, $V_{IN1\_1}$ indicates a voltage of a first input terminal of the main comparison circuit CMP_1 to which the analog signal Signal is input, $V_{IN2\_1}$ indicates a voltage of a second input terminal of the main comparison circuit CMP_1 to which the ramp wave Ramp is input, $V_{IN1\_2}$ indicates a voltage of a first input terminal of the sub-comparison circuit CMP_2 to which the analog signal Signal is input, and $V_{IN2\_2}$ indicates a voltage of a second input terminal of the sub-comparison circuit CMP_2 to which the ramp wave Ramp is input. Furthermore, in FIG. 2, Q0 to Q7 indicate signals that are output from the latch circuits L_0 to L_7 of the latch unit 33.

First, the analog signal Signal to be subjected to AD conversion and the ramp wave Ramp, which decreases with the passage of time, are input to the main comparison circuit CMP_1 and the sub-comparison circuit CMP_2 constituting the comparison unit 31. Then, an offset voltage is applied to the second input terminal of the main comparison circuit CMP_1 to which the ramp wave Ramp is input. In this way, the voltage $V_{IN2\_1}$ of the second input terminal of the main comparison circuit CMP_1 is higher than the voltage $V_{IN2\_2}$ of the second input terminal of the sub-comparison circuit CMP_2. The application of the offset voltage, for example, is possible when the method disclosed in Patent Literature 1 is applied to the main comparison circuit CMP_1 while the sub-comparison circuit CMP_2 is in a reset (auto-zero) state.

Next, a start pulse StartP is shifted from an L state to an H state, so that the delay units DU[0] to DU[7] of the clock generation unit 30 start to operate. The delay unit DU[0] constituting the clock generation unit 30 delays the start pulse StartP and outputs the output clock CK[0], and the delay units DU[1] to DU[7] constituting the clock generation unit 30 delay output signals of delay units of a previous stage and output the output clocks CK[1] to CK[7], respectively. The output clocks CK[0] to CK[7] of the delay units DU[0] to DU[7] are input to the latch circuits L_0 to L_7 of the latch unit 33.

Almost at the same time as the start of the operation of the delay units DU[0] to DU[7], the voltage of the ramp wave Ramp starts to be reduced, and the main comparison circuit CMP_1 and the sub-comparison circuit CMP_2 start a comparison operation. The comparison outputs C0_1 and C0_2 at the time point at which the main comparison circuit CMP_1 and the sub-comparison circuit CMP_2 have started the comparison operation are in an L state. Furthermore, a control signal Enable is in an H state. At this time point, since the control signal Hold_L is in an L state and the control signal Hold_C is in an H state, the latch circuits L_0 to L_6 enter a disable state and the latch circuit L_7 enters an enable state. The latch circuit L_7 outputs the received output clock CK[7] of the delay unit DU[7] to the counting unit 34 without change.

The counting unit 34 performs a counting operation based on the output clock CK[7]. In this counting operation, a count value increases or decreases with the rise or fall of the output clock CK[7].

Then, in the sub-comparison circuit CMP_2, the voltages of the analog signal Signal and the ramp wave Ramp approximately coincide with each other, so that the comparison output C0_2 is inverted from an L state to an H state. At this time point (the second timing), since the control signal Hold_L is in an H state and the control signal Hold_C is in an H state, the latch circuits L_0 to L_7 enter an enable state.

Then, in the main comparison circuit CMP_1, the voltages of the analog signal Signal and the ramp wave Ramp approximately coincide with each other, so that the comparison output C0_1 is inverted from an L state to an H state. At this time point (the first timing), since the control signal Hold_L is in an L state and the control signal Hold_C is in an L state, the latch circuits L_0 to L_7 enter a disable state. In this way, the latch circuits L_0 to L_7 latch the logical states of the output clocks CK[0] to CK[7] that are lower phase signals from the delay units DU[0] to DU[7].

The counting unit 34 latches the count value when the latch circuit L_7 of the latch unit 33 stops. According to the logical state latched by the latch unit 33 and the count value latched by the counting unit 34, digital data corresponding to the analog signal Signal is obtained. Data latched in the latch circuits L_0 to L_7 is output to a circuit of a next stage, and is subjected to processing such as binarization (encoding) and the like.

(Second Operation)

Figure 3:
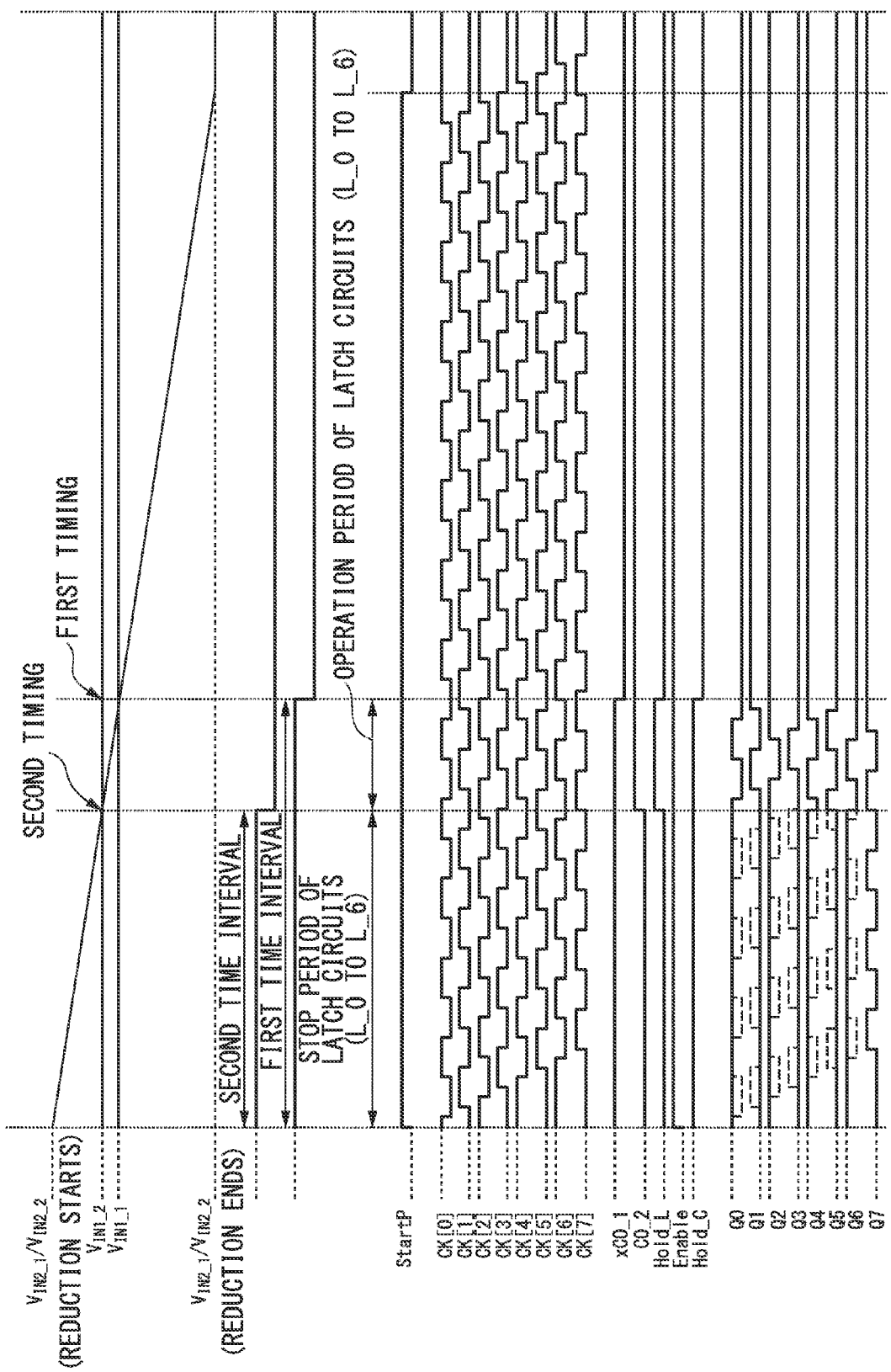
FIG. 3 is a timing chart illustrating the operation of an AD conversion circuit in accordance with the first preferred embodiment of the present invention.

Next, a second operation will be described. FIG. 3 illustrates the second operation of the AD conversion circuit in accordance with the first preferred embodiment. In FIG. 3, $V_{IN1\_1}$ indicates a voltage of the first input terminal of the main comparison circuit CMP_1 to which the analog signal Signal is input, $V_{IN2\_1}$ indicates a voltage of the second input terminal of the main comparison circuit CMP__1 to which the ramp wave Ramp is input, $V_{IN1\_2}$ indicates a voltage of the first input terminal of the sub-comparison circuit CMP__2 to which the analog signal Signal is input, and $V_{IN2\_2}$ indicates a voltage of the second input terminal of the sub-comparison circuit CMP__2 to which the ramp wave Ramp is input. Furthermore, in FIG. 3, Q0 to Q7 indicate signals that are output from the latch circuits L__0 to L__7 of the latch unit 33.

First, the analog signal Signal to be subjected to AD conversion and the ramp wave Ramp, which decreases with the passage of time, are input to the main comparison circuit CMP__1 and the sub-comparison circuit CMP__2 constituting the comparison unit 31. Then, an offset voltage is applied to the first input terminal of the main comparison circuit CMP__1 to which the analog signal Signal is input. In this way, the voltage $V_{IN1\_1}$ of the first input terminal of the main comparison circuit CMP__1 is lower than the voltage $V_{IN1\_2}$ of the first input terminal of the sub-comparison circuit CMP__2. The application of the offset voltage, for example, is applied only to the main comparison circuit CMP__1.

Next, the start pulse StartP is shifted from an L state to an H state, so that the delay units DU[0] to DU[7] of the clock generation unit 30 start to operate. The delay unit DU[0] constituting the clock generation unit 30 delays the start pulse StartP and outputs the output clock CK[0], and the delay units DU[1] to DU[7] constituting the clock generation unit 30 delay output signals of delay units of a previous stage and output the output clocks CK[1] to CK[7], respectively. The output clocks CK[0] to CK[7] of the delay units DU[0] to DU[7] are input to the latch circuits L__0 to L__7 of the latch unit 33.

Almost at the same time as the start of the operation of the delay units DU[0] to DU[7], the voltage of the ramp wave Ramp starts to be reduced, and the main comparison circuit CMP__1 and the sub-comparison circuit CMP__2 start a comparison operation. The comparison outputs C0__1 and C0__2 at the time point at which the main comparison circuit CMP__1 and the sub-comparison circuit CMP__2 have started the comparison operation are in an L state. Furthermore, the control signal Enable is in an H state. At this time point, since the control signal Hold_L is in an L state and the control signal Hold_C is in an H state, the latch circuits L__0 to L__6 enter a disable state and the latch circuit L__7 enters an enable state. The latch circuit L__7 outputs the received output clock CK[7] of the delay unit DU[7] to the counting unit 34 without change.

The counting unit 34 performs a counting operation based on the output clock CK[7]. In this counting operation, a count value increases or decreases with the rise or fall of the output clock CK[7].

Then, in the sub-comparison circuit CMP__2, the voltages of the analog signal Signal and the ramp wave Ramp approximately coincide with each other, so that the comparison output C0__2 is inverted from an L state to an H state. At this time point (the second timing), since the control signal Hold_L is in an H state and the control signal Hold_C is in an H state, the latch circuits L__0 to L__7 enter an enable state.

Then, in the main comparison circuit CMP__1, the voltages of the analog signal Signal and the ramp wave Ramp approximately coincide with each other, so that the comparison output C0__1 is inverted from an L state to an H state. At this time point (the first timing), since the control signal Hold_L is in an L state and the control signal Hold_C is in an L state, the latch circuits L__0 to L__7 enter a disable state. In this way, the latch circuits L__0 to L__7 latch the logical states of the output clocks CK[0] to CK[7] that are the lower phase signals from the delay units DU[0] to DU[7].

The counting unit 34 latches the count value when the latch circuit L__7 of the latch unit 33 stops. According to the logical state latched by the latch unit 33 and the count value latched by the counting unit 34, digital data corresponding to the analog signal Signal is obtained. Data latched in the latch circuits L__0 to L__7 is output to a circuit of a next stage, and is subjected to processing such as binarization (encoding) and the like.

In the aforementioned two operations, the latch circuits L__0 to L__6 operate only in the period from the second timing to the first timing, so that it is possible to reduce the current consumption in the latch unit 33.

Furthermore, in the first preferred embodiment, the operations of the latch circuits L__0 to L__6 constituting the latch unit 33 are controlled using the first lower phase signal as the output clocks CK[0] to CK[6] of the clock generation unit 30, so that low current consumption is achieved. However, for example, the same control as the control for the latch circuits L__0 to L__6 may be performed for the latch circuits L__0 to L__5 using the first lower phase signal as the output clocks CK[0] to CK[5] of the clock generation unit 30. Furthermore, the present invention is not limited thereto.

As described above, according to the first preferred embodiment, it is not necessary to provide the latch control unit including the inversion delay circuit as with the related art. Accordingly, it is possible to reduce transient bounce of power and ground due to power concentration. In this way, it is possible to suppress the reduction of AD conversion accuracy. Furthermore, the sub-comparison circuit is provided and causes an increase in current consumption. However, since current consumption of the sub-comparison circuit is small and it is also possible to operate the sub-comparison circuit only in the AD conversion period, an increase in current consumption in the comparison unit 31 is minimal.

Second Preferred Embodiment

Next, a second preferred embodiment of the present invention will be described. The difference from the first preferred embodiment is the configuration and the operation of the comparison unit 31. Since configurations other than the comparison unit 31 are approximately the same as the configurations in the first preferred embodiment, a description thereof will be omitted.

Figure 4:
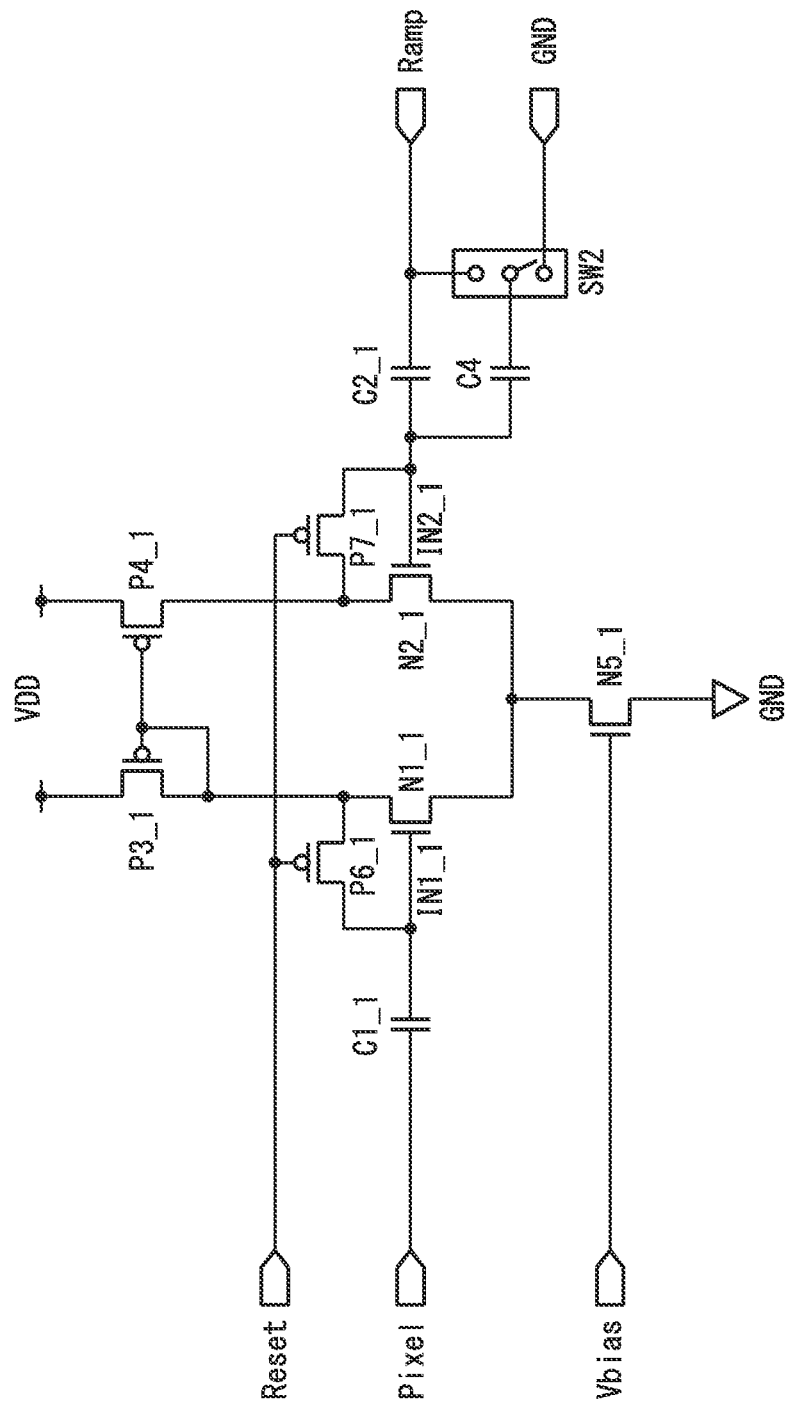
FIG. 4 is a circuit diagram illustrating the configuration of a main comparison circuit provided in an AD conversion circuit in accordance with a second preferred embodiment of the present invention.

First, the configuration of the main comparison circuit CMP__1 constituting the comparison unit 31 will be described. FIG. 4 illustrates an example of a detailed circuit configuration of the main comparison circuit CMP__1 constituting the comparison unit 31.

The main comparison circuit CMP__1 has a differential amplifier. The differential amplifier includes NMOS transistors N1__1 and N2__1, PMOS transistors P3__1 and P4__1, and an NMOS current source N5__1. The NMOS transistors N1__1 and N2__1 have sources commonly connected to each other. The PMOS transistors P3__1 and P4__1 are connected between drains of the NMOS transistors N1__1 and N2__1 and the power supply VDD, and have gates commonly connected to each other. The NMOS current source N5__1 is connected between a node commonly connected to the sources of the NMOS transistors N1__1 and N2__1 and the ground GND.

In the differential amplifier, a PMOS transistor P6__1 is connected between the gate and the drain of the NMOS transistor N1__1 and a PMOS transistor P7__1 is connected between the gate and the drain of the NMOS transistor N2__1.

The PMOS transistors P6_1 and P7_1 function as reset units that enter an ON state when a reset pulse Reset in a Low active state is applied to gates of the PMOS transistors P6_1 and P7_1, short-circuit the gate and the drain of the NMOS transistor N1_1 and the gate and the drain of the NMOS transistor N2_1, and reset voltages of the gates of the NMOS transistor N1_1 and N2_1, that is, voltages of two input terminals (a first input terminal IN1_1 and a second input terminal IN2_1) of the differential amplifier.

The gates of the NMOS transistors N1_1 and N2_1 are connected to one ends of capacitive elements C1_1 and C2_1, respectively, that cut a DC level. As an analog signal to be subjected to AD conversion, for example, a pixel signal Pixel output from a pixel provided in a solid-state image pickup device is applied to the other end of the capacitive element C1_1. A ramp wave Ramp is applied to the other end of the capacitive element C2_1.

A capacitive element C4 and a switch element SW2 for applying an offset voltage to the second input terminal IN2_1 are provided on the side of the second input terminal IN2_1. One end of the capacitive element C4 is connected to the gate of the NMOS transistor N2_1, and the other end of the capacitive element C4 is connected to a first terminal of the switch element SW2. A second terminal of the switch element SW2 is connected to the ground GND, and a third terminal of the switch element SW2 is connected to the other end of the capacitive element C2_1. By a control signal (not illustrated), the switch element SW2 switches a state in which the first terminal and the second terminal are short-circuited and thus the ground GND is connected to the other end of the capacitive element C4, and a state in which the first terminal and the third terminal are short-circuited and thus the other end of the capacitive element C2_1 is connected to the other end of the capacitive element C4. Furthermore, a bias voltage Vbias for controlling a current value is applied to a gate of the current source N5_1.

Hereinafter, an operation of the second preferred embodiment will be described. Furthermore, it is assumed that a voltage of the ground GND is set as $V_{GND}$, a reset level voltage applied as the pixel signal Pixel is set as $V_R$, a signal level voltage applied as the pixel signal Pixel is set as $V_S$ ($V_S \leq V_R$), the capacitance value of the capacitive element C2_1 is set as $C_{2\_1}$, and the capacitance value of the capacitive element C4 is set as $C_4$. Furthermore, it is assumed that the voltage of the ramp wave Ramp at a time t is set as $V_{Ramp}(t)$.

Figure 5:
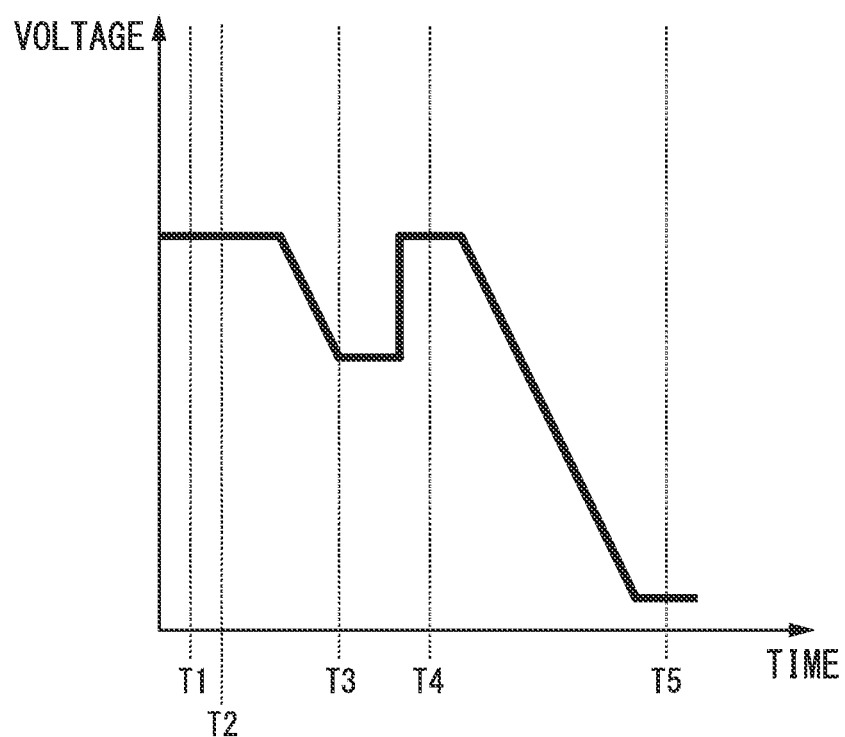
FIG. 5 is a timing chart illustrating the waveform of a ramp wave in accordance with the second preferred embodiment of the present invention.

FIG. 5 illustrates the waveform of the ramp wave Ramp applied from the reference signal generation unit 35 to the main comparison circuit CMP_1. In FIG. 5, a horizontal axis denotes time and a vertical axis denotes voltage. FIG. 5 illustrates times T1 to T5 to be used in the following description.

FIG. 6A and FIG. 6B illustrate a voltage change (FIG. 6A) in the first input terminal IN1_1 and the second input terminal IN2_1 of the differential amplifier constituting the main comparison circuit CMP_1, and a voltage change (FIG. 6B) in the second input terminal IN2_1 of the differential amplifier constituting the main comparison circuit CMP_1 and the second input terminal IN2_2 of the differential amplifier constituting the sub-comparison circuit CMP_2. In FIG. 6A, a vertical axis denotes voltage, a voltage change at the left side illustrates a change in the voltage $V_{IN1\_1}$ of the first input terminal IN1_1 of the differential amplifier constituting the main comparison circuit CMP_1, and a voltage change at the right side illustrates a change in the voltage $V_{IN2\_1}$ of the second input terminal IN2_1 of the differential amplifier constituting the main comparison circuit CMP_1. In FIG. 6B, a horizontal axis denotes time and a vertical axis denotes voltage. In FIG. 6B, a solid line denotes the voltage $V_{IN2\_1}$ of the second input terminal IN2_1 of the differential amplifier constituting the main comparison circuit CMP_1, and a double dotted line denotes the voltage $V_{IN2\_2}$ of the second input terminal IN2_2 of the differential amplifier constituting the sub-comparison circuit CMP_2.

After the reset level is applied to the first input terminal IN1_1 as the pixel signal Pixel and the ramp wave Ramp applied to the second input terminal IN2_1 is stabilized, the reset pulse Reset is activated (Low active state) before the comparison start in the main comparison circuit CMP_1. In this way, since the PMOS transistors P6_1 and P7_1 enter an ON state, the gates and the drains of the NMOS transistors N1_1 and N2_1 are short-circuited, so that the voltages of the two input terminals are reset by employing operating points of the NMOS transistors N1_1 and N2_1 as drain voltages. During the reset operation, the other end of the capacitive element C4 is connected to the ground GND by the switch element SW2.

At the operating points decided by the reset, the voltages of the two input terminals of the differential amplifier, that is, offset components of the gate voltages of the NMOS transistors N1_1 and N2_1, are approximately cancelled. That is, the voltages of the two input terminals of the differential amplifier are reset to be approximately the same voltage $V_{RST\_1}$. At this time point (the time T1), the voltage $V_{IN1\_1}$ of the first input terminal IN1_1 is $V_{RST\_1}$ and the voltage $V_{IN2\_1}$ of the second input terminal IN2_1 is $V_{RST\_1}$. After the reset, the PMOS transistors P6_1 and P7_1 enter an OFF state.

Then, the switch element SW2 connects the other end of the capacitive element C4 to the other end of the capacitive element C2_1, so that the voltage $V_{IN2\_1}$ of the second input terminal IN2_1 to which the ramp wave Ramp is applied, that is, the gate voltage of the transistor N2_1, is increased to a predetermined voltage from the voltage $V_{RST\_1}$. At this time point (the time T2), since the voltage of the ramp wave Ramp is $V_{Ramp}(0)$ and the voltage of the other end of the capacitive element C4 is changed from $V_{GND}$ to $V_{Ramp}(0)$ by ($V_{Ramp}(0) - V_{GND}$), the voltage $V_{IN2\_1}$ of the second input terminal IN2_1 at this time point (the time T2) is expressed by the following Equation (1). In Equation (1) below, the second term of the right side indicates an offset voltage $\Delta V_{OFFSET\_2}$ applied to the second input terminal IN2_1.

$$V_{IN2\_1} = V_{RST\_1} + \frac{C_4}{C_{2\_1} + C_4} \times (V_{Ramp}(0) - V_{GND}) \quad (1)$$

After the reset operation of the main comparison circuit CMP_1, even when there is a slight variation in the voltages of the two input terminals of the differential amplifier constituting the main comparison circuit CMP_1, since $V_{GND} < V_{Ramp}(0)$, the voltage $V_{IN2\_1}$ (Equation (1) above) of the second input terminal IN2_1 at the time of the comparison start in the main comparison circuit $CMP_1$ according to the reset level is higher than the voltage $V_{IN1\_1}$ ($V_{RST\_1}$) of the first input terminal IN1_1.

At a predetermined timing after the time T2, the voltage of the ramp wave Ramp starts to be reduced. Hereinafter, using FIG. 7, the voltage $V_{IN2\_1}$ of the second input terminal IN2_1, to which the ramp wave Ramp is applied, will be described.

Figure 7:
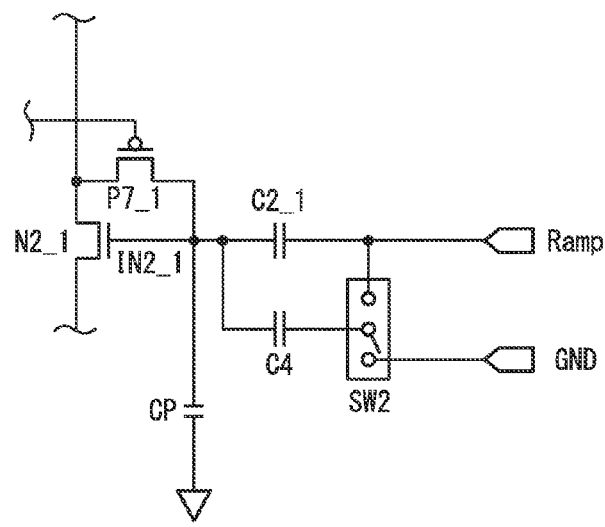
FIG. 7 is a diagram for explaining a voltage change in input terminals of a main comparison circuit provided in an AD conversion circuit in accordance with the second preferred embodiment of the present invention.

FIG. 7 illustrates only an extracted peripheral configuration of the second input terminal IN2_1. Hereinafter, the following description will be given on the assumption that there is parasitic capacitance CP between the second input terminal IN2_1 and the ground GND.

When a change in the voltage of the other end of the capacitive element C2_1 when the voltage of the ramp wave Ramp applied to the other end of the capacitive element C2_1 has changed from $V_{Ramp}(0)$ to $V_{Ramp}(t)$ by ($V_{Ramp}(t)-V_{Ramp}(0)$) is set as ΔV1, ΔV1 is expressed by the following Equation (2).

$$\Delta V1 = V_{Ramp}(t) - V_{Ramp}(0) \qquad (2)$$

After the time T2, since the transistor P7_1 enters an OFF state, the amount of charge accumulated in the capacitive elements C2_1 and C4 and the parasitic capacitance CP is held. Accordingly, when a change in the voltage $V_{IN2\_1}$ of the second input terminal IN2_1 when the voltage of the ramp wave Ramp applied to the other end of the capacitive element C2_1 has changed from $V_{Ramp}(0)$ to $V_{Ramp}(t)$ by ($V_{Ramp}(t)-V_{Ramp}(0)$) is set as ΔV2, ΔV2 is expressed by the following Equation (3). Furthermore, the capacitive element C2_1 and the capacitive element C4 are connected in parallel to each other and a capacitance value obtained by synthesizing the capacitive element C2_1 with the capacitive element C4, which are connected in parallel to each other, is $C_C$ of Equation (3) below. Furthermore, in Equation (3) below, $C_P$ is a capacitance value of the parasitic capacitance CP.

$$\Delta V2 = \frac{C_C}{C_C + C_P} \times \Delta V1 \qquad (3)$$

When $C_P$ is negligible compared to $C_C$ ($C_C \gg C_P$), ΔV2 is equal to ΔV1. Since the voltage $V_{IN2\_1}$ of the second input terminal IN2_1 at the time T2 is expressed by Equation 1 above, the voltage $V_{IN2\_1}$ of the second input terminal IN2_1 after the voltage of the ramp wave Ramp has started to be reduced after the time T2 is expressed by the following Equation (4).

$$\begin{aligned} V_{IN2\_1} &= V_{RST\_1} + \frac{C_4}{C_{2\_1}+C_4} \times (V_{Ramp}(0) - V_{GND}) + \Delta V2 \\ &= V_{RST\_1} + \frac{C_4}{C_{2\_1}+C_4} \times (V_{Ramp}(0) - V_{GND}) + \Delta V1 \\ &= V_{RST\_1} + \frac{C_4}{C_{2\_1}+C_4} \times (V_{Ramp}(0) - V_{GND}) + \\ &\quad (V_{Ramp}(t) - V_{Ramp}(0)) \end{aligned} \qquad (4)$$

At the timing at which the voltage $V_{IN2\_1}$ of the second input terminal IN2_1, to which the ramp wave Ramp has been applied, approximately coincides with the voltage $V_{IN1\_1}$ of the first input terminal IN1_1 to which the reset level has been applied, the comparison output C0_1 of the main comparison circuit CMP_1 is inverted. At the time point (the time T3) at which a predetermined period has passed after the voltage of the ramp wave Ramp starts to be reduced, the reference signal generation unit 35 stops the generation of the ramp wave Ramp.

Then, after starting the generation of the ramp wave Ramp again, a signal level is applied to the first input terminal IN1_1 as the pixel signal Pixel. At the time point (the time T2) at which the other end of the capacitive element C4 has been connected to the capacitive element C2_1 by the switch element SW2, the voltage of the other end of the capacitive element C1_1, to which the reset level is applied as the pixel signal Pixel, is $V_R$. Furthermore, at the time point (the time T4) at which the signal level has been input as the pixel signal Pixel, the voltage of the other end of the capacitive element C1_1 is $V_S$. Consequently, the voltage $V_{IN1\_1}$ of the first input terminal IN1_1 at the time T4 is expressed by the following Equation (5).

$$V_{IN1\_1} = V_{RST\_1} + (V_S - V_R) \qquad (5)$$

At the time T4, the voltage $V_{IN2\_1}$ of the second input terminal IN2_1, to which the ramp wave Ramp is applied, is expressed by the aforementioned Equation (1). Since $V_{GND} < V_{Ramp}(0)$ in Equation (1) and $V_S \leq T_R$ in Equation (5), the voltage $V_{IN2\_1}$ of Equation (1) is higher than the voltage $V_{IN1\_1}$ of Equation (5). That is, the voltage $V_{IN2\_1}$ of the second input terminal IN2_1 at the time of the comparison start in the main comparison circuit CMP_1 according to the signal level is higher than the voltage $V_{IN1\_1}$ of the first input terminal IN1_1.

At a predetermined timing after the time T4, the voltage of the ramp wave Ramp starts to be reduced. The voltage $V_{IN2\_1}$ of the second input terminal IN2_1 after the time point at which the voltage of the ramp wave Ramp has started to be reduced is expressed by the aforementioned Equation (4). At the timing at which the voltage $V_{IN2\_1}$ of the second input terminal IN2_1, to which the ramp wave Ramp is applied, approximately coincides with the voltage $V_{IN1\_1}$ of the first input terminal IN1_1 to which the signal level has been applied, the comparison output C0_1 of the main comparison circuit CMP_1 is inverted. At the time point (the time T5) at which a predetermined period has passed after the voltage of the ramp wave Ramp starts to be reduced, the reference signal generation unit 35 stops the generation of the ramp wave Ramp.

Figure 8:
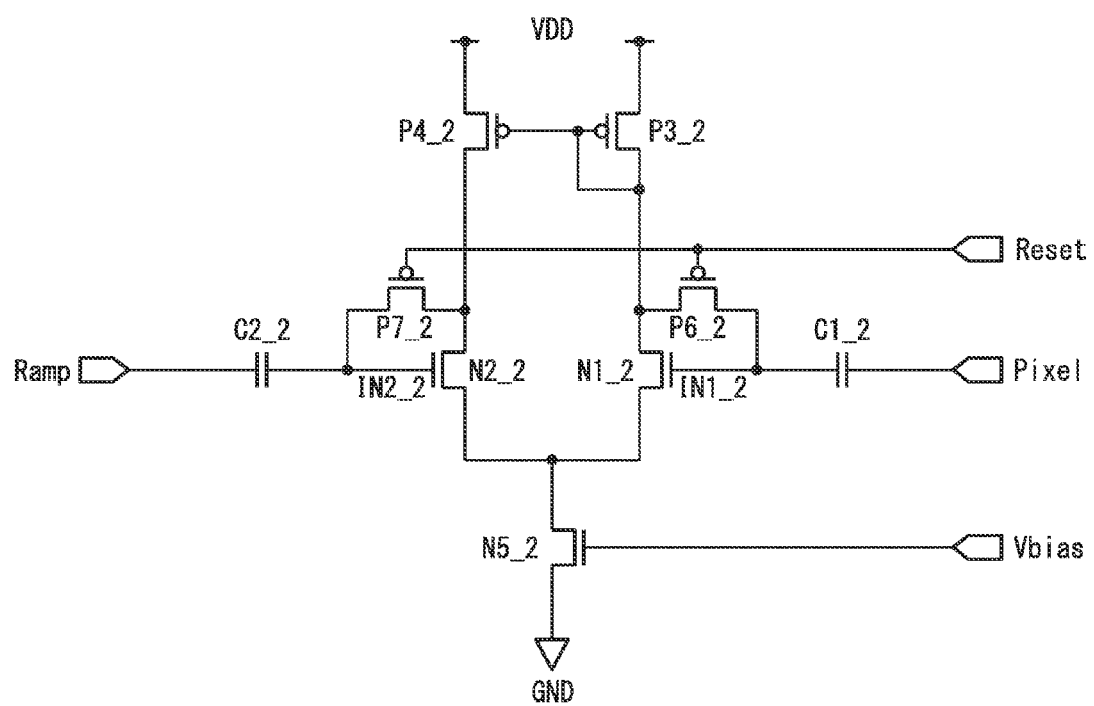
FIG. 8 is a circuit diagram illustrating the configuration of a sub-comparison circuit provided in an AD conversion circuit in accordance with the second preferred embodiment of the present invention.

Next, the configuration of the sub-comparison circuit CMP_2 constituting the comparison unit 31 will be described. FIG. 8 illustrates an example of a detailed circuit configuration of the sub-comparison circuit CMP_2 constituting the comparison unit 31. The configuration of the sub-comparison circuit CMP_2 is approximately the same as the configuration of the main comparison circuit CMP_1, except that the capacitive element C4 and the switch element SW2 are deleted from the configuration of the main comparison circuit CMP_1.

The sub-comparison circuit CMP_2 has a differential amplifier. The differential amplifier includes NMOS transistors N1_2 and N2_2, PMOS transistors P3_2 and P4_2, and an NMOS current source N5_2. The NMOS transistors N1_2 and N2_2 have sources commonly connected to each other. The PMOS transistors P3_2 and P4_2 are connected between drains of the NMOS transistors N1_2 and N2_2 and the power supply VDD, and have gates commonly connected to each other. The NMOS current source N5_2 is connected between a node commonly connected to the sources of the NMOS transistors N1_2 and N2_2 and the ground GND.

In the differential amplifier, a PMOS transistor P6_2 is connected between the gate and the drain of the NMOS transistor N1_2 and a PMOS transistor P7_2 is connected between the gate and the drain of the NMOS transistor N2_2. The PMOS transistors P6_2 and P7_2 function as reset units that enter an ON state when a reset pulse Reset in a Low active state is applied to gates of the PMOS transistors P6_2 and P7_2, short-circuit the gate and the drain of the NMOS transistor N1_2 and the gate and the drain of the NMOS transistor N2_2, and reset voltages of the gates of the NMOS transistor N1_2 and N2_2, that is, voltages of two input terminals (a first input terminal IN1_2 and a second input terminal IN2_2) of the differential amplifier.

The gates of the NMOS transistors N1__2 and N2__2 are connected to one ends of capacitive elements C1__2 and C2__2, respectively, that cut a DC level. As an analog signal to be subjected to AD conversion, for example, a pixel signal Pixel output from a pixel provided in a solid-state image pickup device is applied to the other end of the capacitive element C1__2. A ramp wave Ramp is applied to the other end of the capacitive element C2__2. Furthermore, a bias voltage Vbias for controlling a current value is applied to a gate of the NMOS current source N5__2.

Furthermore, it is preferable that a capacitance value $C_{2\_2}$ of the capacitive element C2__2 of the sub-comparison circuit CMP__2 be approximately equal to a capacitance value $(C_{2\_1}+C_4)$ of the sum of a capacitance value $C_2$ of the capacitive element C2__1 of the main comparison circuit CMP__1 and a capacitance value $C_4$ of the capacitive element C4 such that the voltage $V_{IN2\_2}$ of the second input terminal IN2__2 of the sub-comparison circuit CMP__2, to which the ramp wave Ramp is applied and the voltage $V_{IN2\_1}$ of the second input terminal IN2__1 of the main comparison circuit CMP__1 are changed with approximately the same inclination. However, the present invention is not limited to this configuration as long as the second timing is earlier than the first timing.

Hereinafter, an operation of the second preferred embodiment will be described. Furthermore, it is assumed that a reset level voltage applied as the pixel signal Pixel is set as $V_R$ and a signal level voltage applied as the pixel signal Pixel is set as $V_S$ ($V_S \leq V_R$). Furthermore, it is assumed that a voltage of the ramp wave Ramp at a time t is set as $V_{Ramp}(t)$. A waveform of the ramp wave Ramp applied to the sub-comparison circuit CMP__2 from the reference signal generation unit 35 is the waveform illustrated in FIG. 5.

FIG. 9A and FIG. 9B illustrate a voltage change (FIG. 9A) in the second input terminal IN2__2 of the differential amplifier constituting the sub-comparison circuit CMP__2 and the second input terminal IN2__1 of the differential amplifier constituting the main comparison circuit CMP__1, and a voltage change (FIG. 9B) in the first input terminal IN1__2 and the second input terminal IN2__2 of the differential amplifier constituting the sub-comparison circuit CMP__2. In FIG. 9A, a horizontal axis denotes time and a vertical axis denotes voltage. In FIG. 9A, a solid line denotes the voltage $V_{IN2\_2}$ of the second input terminal IN2__2 of the differential amplifier constituting the sub-comparison circuit CMP__2, and a double dotted line denotes the voltage $V_{IN2\_1}$ of the second input terminal IN2__1 of the differential amplifier constituting the main comparison circuit CMP__1. In FIG. 9B, a vertical axis denotes voltage, a voltage change at the left side illustrates a change in the voltage $V_{IN2\_2}$ of the second input terminal IN2__2 constituting the sub-comparison circuit CMP__2, and a voltage change at the right side illustrates a change in the voltage $V_{IN1\_2}$ of the first input terminal IN1__2 constituting the sub-comparison circuit CMP__2.

After the reset level is applied to the first input terminal IN1__2 as the pixel signal Pixel and the ramp wave Ramp applied to the second input terminal IN2__2 is stabilized, the reset pulse Reset is activated (Low active state) before the comparison start in the sub-comparison circuit CMP__2. In this way, since the PMOS transistors P6__2 and P7__2 enter an ON state, the gates and the drains of the NMOS transistors N1__2 and N2__2 are short-circuited, so that the voltages of the two input terminals are reset by employing operating points of the NMOS transistors N1__2 and N2__2 as drain voltages.

At the operating points decided by the reset, the voltages of the two input terminals of the differential amplifier, that is, offset components of the gate voltages of the NMOS transistors N1__2 and N2__2, are approximately cancelled. That is, the voltages of the two input terminals of the differential amplifier are reset to be approximately the same voltage $V_{RST\_2}$. At this time point (the time T1), the voltage $V_{IN1\_2}$ of the first input terminal IN1__2 is $V_{RST\_2}$ and the voltage $V_{IN2\_2}$ of the second input terminal IN2__2 is $V_{RST\_2}$. After the reset, the PMOS transistors P6__2 and P7__2 enter an OFF state.

Then, in the main comparison circuit CMP__1, as described above, the voltage $V_{IN2\_1}$ of the second input terminal IN2__1, to which the ramp wave Ramp is applied, is increased to a predetermined voltage from the voltage $V_{RST\_1}$. At this time, in the sub-comparison circuit CMP__2, there is no change in the voltage $V_{IN2\_2}$ of the second input terminal IN2__2 to which the ramp wave Ramp is applied. The voltage $V_{IN1\_2}$ of the first input terminal IN1__2 and the voltage $V_{IN2\_2}$ of the second input terminal IN2__2 at this time point (the time T2) are $V_{RST\_2}$.

At a predetermined timing after the time T2, the voltage of the ramp wave Ramp starts to be reduced. The voltage $V_{IN2\_2}$ of the second input terminal IN2__2 after the voltage of the ramp wave Ramp starts to be reduced is expressed by the following Equation (6).

$$V_{IN2\_2} = V_{RST\_2} + (V_{Ramp}(t) - V_{Ramp}(0)) \quad (6)$$

At the timing at which the voltage $V_{IN2\_2}$ of the second input terminal IN2__2, to which the ramp wave Ramp has been applied, approximately coincides with the voltage $V_{IN1\_2}$ of the first input terminal IN1__2 to which the reset level has been applied, the comparison output C0__2 of the sub-comparison circuit CMP__2 is inverted. At the time point (the time T3) at which a predetermined period has passed after the voltage of the ramp wave Ramp starts to be reduced, the reference signal generation unit 35 stops the generation of the ramp wave Ramp.

Then, after starting the generation of the ramp wave Ramp again, a signal level is applied to the first input terminal IN1__2 as the pixel signal Pixel. At the time point (the time T2) at which the voltage $V_{IN2\_1}$ of the second input terminal IN2__1 of the main comparison circuit CMP__1 has increased, the voltage of the other end of the capacitive element C1__2, to which the reset level has been applied as the pixel signal Pixel, is $V_R$. Furthermore, at the time point (the time T4) at which the signal level has been input as the pixel signal Pixel, the voltage of the other end of the capacitive element C1__2 is $V_S$. Consequently, the voltage $V_{IN1\_2}$ of the first input terminal IN1__2 at the time T4 is expressed by the following Equation (7).

$$V_{IN1\_2} = V_{RST\_2} + (V_S - V_R) \quad (7)$$

At the time T4, the voltage $V_{IN2\_2}$ of the second input terminal IN2__2, to which the ramp wave Ramp is applied, is $V_{RST\_2}$. At a predetermined timing after the time T4, the voltage of the ramp wave Ramp starts to be reduced. The voltage $V_{IN2\_2}$ of the second input terminal IN2__2 after the time point at which the voltage of the ramp wave Ramp has started to be reduced is expressed by the aforementioned Equation (6). At the timing at which the voltage $V_{IN2\_2}$ of the second input terminal IN2__2, to which the ramp wave Ramp has been applied, approximately coincides with the voltage $V_{IN1\_2}$ of the first input terminal IN1__2 to which the signal level has been applied, the comparison output C0__2 of the sub-comparison circuit CMP__2 is inverted. At the time point (the time T5) at which a predetermined period has passed after the voltage of the ramp wave Ramp starts to be reduced, the reference signal generation unit 35 stops the generation of the ramp wave Ramp.

As illustrated in FIGS. 6A, 6B, 9A, and 9B, the offset voltage $\Delta V_{OFFSET\_2}$ is applied to the voltage $V_{IN2\_1}$ of the second input terminal IN2__1 of the main comparison circuit CMP__1, so that the voltage $V_{IN2\_1}$ of the second input terminal IN2__1 of the main comparison circuit CMP__1 is higher than the voltage $V_{IN2\_2}$ of the second input terminal IN2__2 of the sub-comparison circuit CMP__2 during the comparison operation period in the comparison unit 31 according to the reset level and the signal level. In this way, it is possible to allow the first timing, at which the comparison output C0__1 of the main comparison circuit CMP__1 is inverted, to be later than the second timing at which the comparison output C0__2 of the sub-comparison circuit CMP__2 is inverted.

As described above, according to the second preferred embodiment, even in the case of using the same ramp wave Ramp, it is possible to apply the offset voltage such that the voltage of the second input terminal IN2__1 of the main comparison circuit CMP__1 constituting the comparison unit 31 is different from the voltage of the second input terminal IN2__2 of the sub-comparison circuit CMP__2 constituting the comparison unit 31. In this way, it is possible to easily allow the first timing to be later than the second timing, so that it is possible to suppress the reduction of AD conversion accuracy as described in the first preferred embodiment.

Third Preferred Embodiment

Next, a third preferred embodiment of the present invention will be described. The difference from the first preferred embodiment is the configuration and the operation of the comparison unit 31. Since configurations other than the comparison unit 31 are approximately the same as the configurations in the first preferred embodiment, a description thereof will be omitted here.

Figure 10:
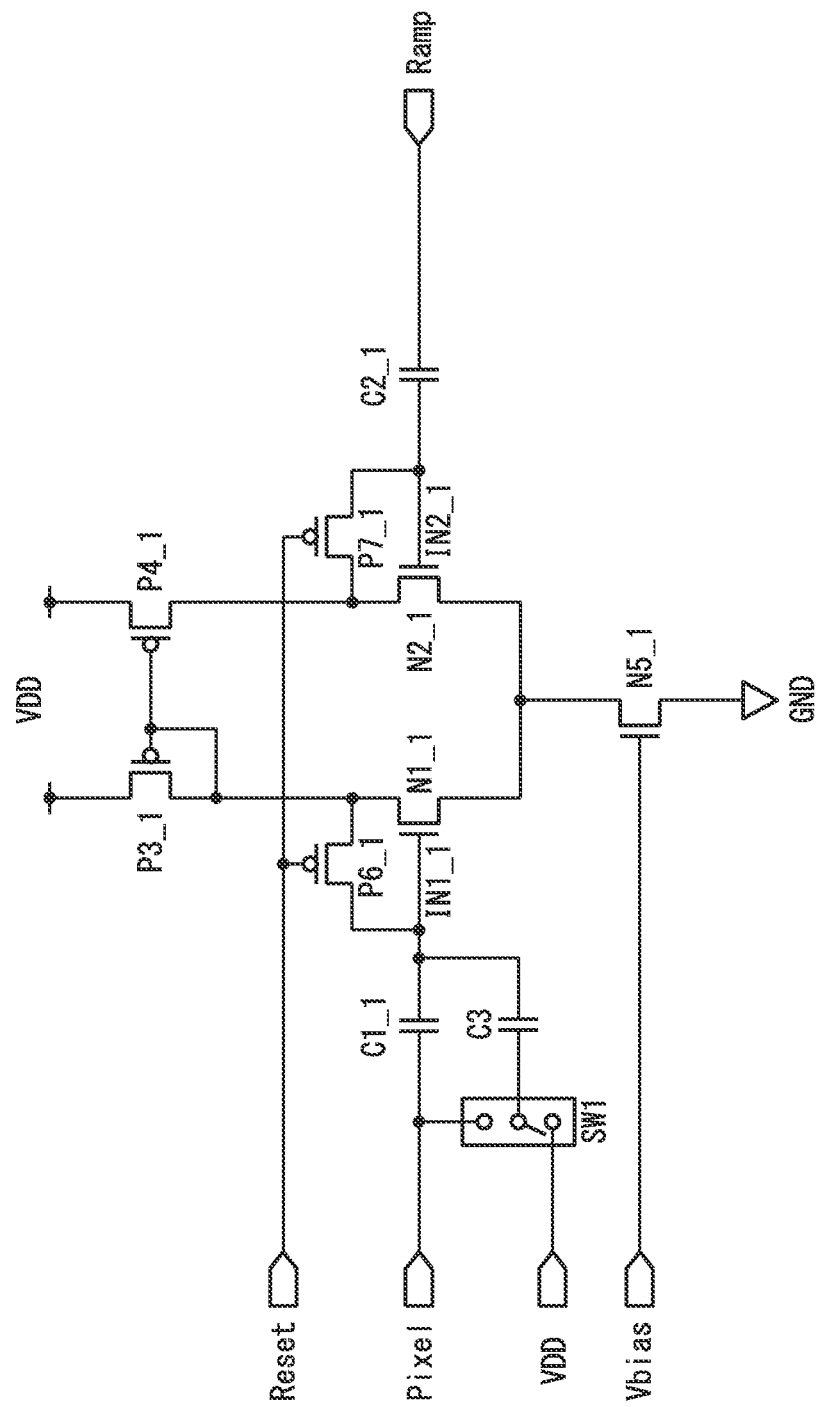
FIG. 10 is a circuit diagram illustrating the configuration of a main comparison circuit provided in an AD conversion circuit in accordance with a third preferred embodiment of the present invention.

First, the configuration of the main comparison circuit CMP__1 constituting the comparison unit 31 will be described. FIG. 10 illustrates an example of a detailed circuit configuration of the main comparison circuit CMP__1 constituting the comparison unit 31.

The difference from the configuration of the main comparison circuit CMP__1 illustrated in FIG. 4 is that the capacitive element C4 and the switch element SW2 are deleted and a capacitive element C3 and a switch element SW1 are added. One end of the capacitive element C3 is connected to the gate of the transistor N1__1 and the other end of the capacitive element C3 is connected to a first terminal of the switch element SW1. A second terminal of the switch element SW1 is connected to the voltage supply VDD and a third terminal of the switch element SW1 is connected to the other end of the capacitive element C1__1. By a control signal (not illustrated), the switch element SW1 switches a state in which the first terminal and the second terminal are short-circuited and thus the voltage supply VDD is connected to the other end of the capacitive element C3, and a state in which the first terminal and the third terminal are short-circuited and thus the other end of the capacitive element C1__1 is connected to the other end of the capacitive element C3.

Hereinafter, an operation of the third preferred embodiment will be described. Furthermore, it is assumed that a voltage of the voltage supply VDD is set as $V_{DD}$, a reset level voltage is set as $V_R$ ($V_R \leq V_{DD}$), a signal level voltage is set as $V_S$ ($V_S \leq V_R$), a capacitance value of the capacitive element C1__1 is set as $C_1$, and a capacitance value of the capacitive element C3 is set as $C_3$. Furthermore, it is assumed that a voltage of the ramp wave Ramp at a time t is set as $V_{Ramp}(t)$. A waveform of the ramp wave Ramp applied to the main comparison circuit CMP__1 from the reference signal generation unit 35 is the waveform illustrated in FIG. 5.

Figure 11B:
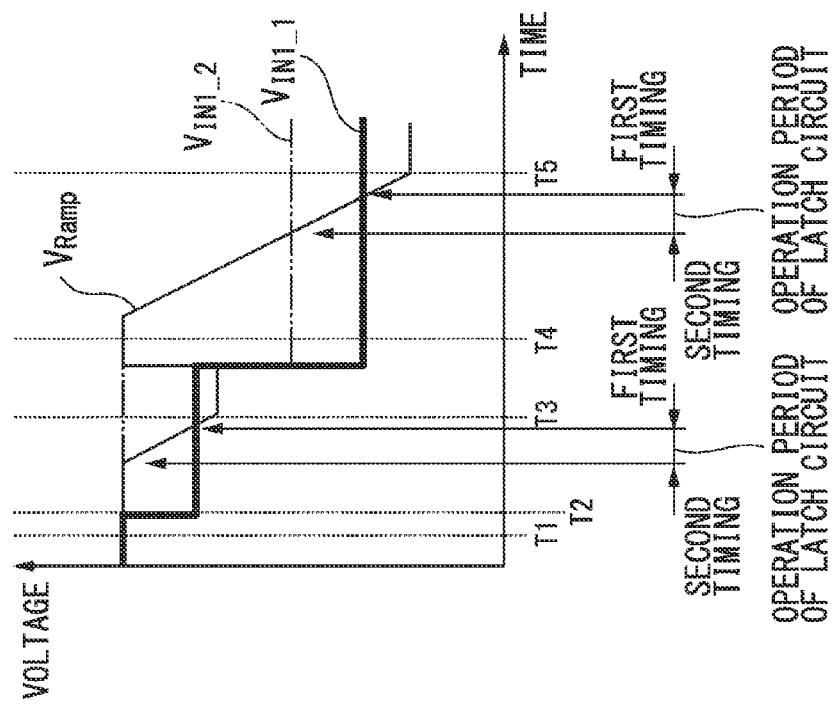
FIG. 11A and FIG. 11B are reference diagrams illustrating a voltage change in input terminals of a main comparison circuit provided in an AD conversion circuit in accordance with the third preferred embodiment of the present invention.
Figure 11A:
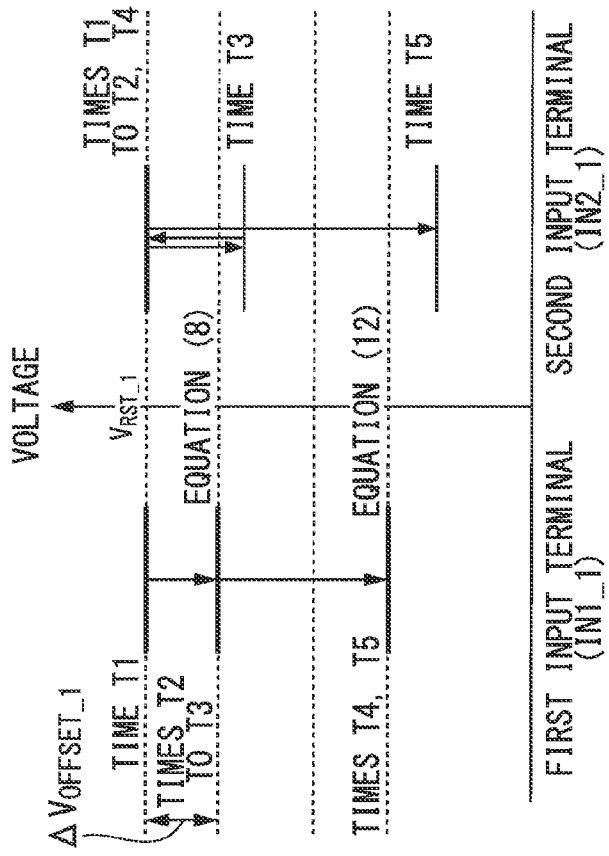

FIG. 11A and FIG. 11B illustrate a voltage change (FIG. 11A) in the first input terminal IN1__1 and the second input terminal IN2__1 of the differential amplifier constituting the main comparison circuit CMP__1, and a voltage change (FIG. 11B) in the first input terminal IN1__1 of the differential amplifier constituting the main comparison circuit CMP__1 and the first input terminal IN1__2 of the differential amplifier constituting the sub-comparison circuit CMP__2. In FIG. 11A, a vertical axis denotes voltage, a voltage change at the left side illustrates a change in the voltage $V_{IN1\_1}$ of the first input terminal IN1__1 of the differential amplifier constituting the main comparison circuit CMP__1, and a voltage change at the right side illustrates a change in the voltage $V_{IN2\_1}$ of the second input terminal IN2__1 of the differential amplifier constituting the main comparison circuit CMP__1. In FIG. 11B, a horizontal axis denotes time and a vertical axis denotes voltage. In FIG. 11B, a thick solid line denotes the voltage $V_{IN1\_1}$ of the first input terminal IN1__1 of the differential amplifier constituting the main comparison circuit CMP__1, a thin solid line denotes the voltage $V_{Ramp}$ of the ramp wave Ramp applied to the second input terminal IN2__1, and a double dotted line denotes the voltage $V_{IN1\_2}$ of the first input terminal IN1__2 of the differential amplifier constituting the sub-comparison circuit CMP__2.

After the reset level is applied to the first input terminal IN1__1 as the pixel signal Pixel and the ramp wave Ramp applied to the second input terminal IN2__1 is stabilized, the reset pulse Reset is activated (Low active state) before the comparison start in the main comparison circuit CMP__1. In this way, since the PMOS transistors P6__1 and P7__1 enter an ON state, the gates and the drains of the NMOS transistors N1__1 and N2__1 are short-circuited, so that the voltages of the two input terminals are reset by employing operating points of the NMOS transistors N1__1 and N2__1 as drain voltages. During the reset operation, the other end of the capacitive element C3 is connected to the power supply VDD by the switch element SW1.

At the operating points decided by the reset, the voltages of the two input terminals of the differential amplifier, that is, offset components of the gate voltages of the NMOS transistors N1__1 and N2__1, are approximately cancelled. That is, the voltages of the two input terminals of the differential amplifier are reset to be approximately the same voltage $V_{RST\_1}$. At this time point (the time T1), the voltage $V_{IN1\_1}$ of the first input terminal IN1__1 is $V_{RST\_1}$ and the voltage $V_{IN2\_1}$ of the second input terminal IN2__1 is $V_{RST\_1}$. After the reset, the PMOS transistors P6__1 and P7__1 enter an OFF state.

Then, the switch element SW1 connects the other end of the capacitive element C3 to the other end of the capacitive element C1__1, so that the voltage $V_{IN1\_1}$ of the first input terminal IN1__1 to which the pixel signal Pixel is applied, that is, the gate voltage of the transistor N1__1, is decreased to a predetermined voltage from the voltage $V_{RST\_1}$. Since the voltage of the other end of the capacitive element C3 is changed from $V_{DD}$ to $V_R$ by ($V_R - V_{DD}$), the voltage $V_{IN1\_1}$ of the first input terminal IN1__1 at this time point (the time T2) is expressed by the following Equation (8). In Equation (8) below, the second term of the right side indicates an offset voltage $\Delta V_{OFFSET\_1}$ applied to the first input terminal IN1__1.

$$V_{IN1\_1} = V_{RST\_1} + \frac{C_3}{C_{1\_1} + C_3} \times (V_R - V_{DD}) \quad (8)$$

After the reset operation of the main comparison circuit CMP_1, even when there is a slight variation in the voltages of the two input terminals of the differential amplifier constituting the main comparison circuit CMP_1, since $V_R < V_{DD}$, the voltage $V_{IN1\_1}$ (Equation (8) above) of the first input terminal IN1_1 at the time of the comparison start in the main comparison circuit CMP_1 according to the reset level is lower than the voltage $V_{IN2\_1}$ ($V_{RST\_1}$) of the second input terminal IN2_1.

At a predetermined timing after the time T2, the voltage of the ramp wave Ramp starts to be reduced. The voltage $V_{IN2\_1}$ of the second input terminal IN2_1 after the voltage of the ramp wave Ramp has started to be reduced is expressed by the following Equation (9).

$$V_{IN2\_1} = V_{RST\_1} + (V_{Ramp}(t) - V_{Ramp}(0)) \quad (9)$$

At the timing at which the voltage $V_{IN2\_1}$ of the second input terminal IN2_1, to which the ramp wave Ramp has been applied, approximately coincides with the voltage $V_{IN1\_1}$ of the first input terminal IN1_1 to which the reset level has been applied, the comparison output C0_1 of the main comparison circuit CMP_1 is inverted. At the time point (the time T3) at which a predetermined period has passed after the voltage of the ramp wave Ramp starts to be reduced, the reference signal generation unit 35 stops the generation of the ramp wave Ramp.

Figure 12:
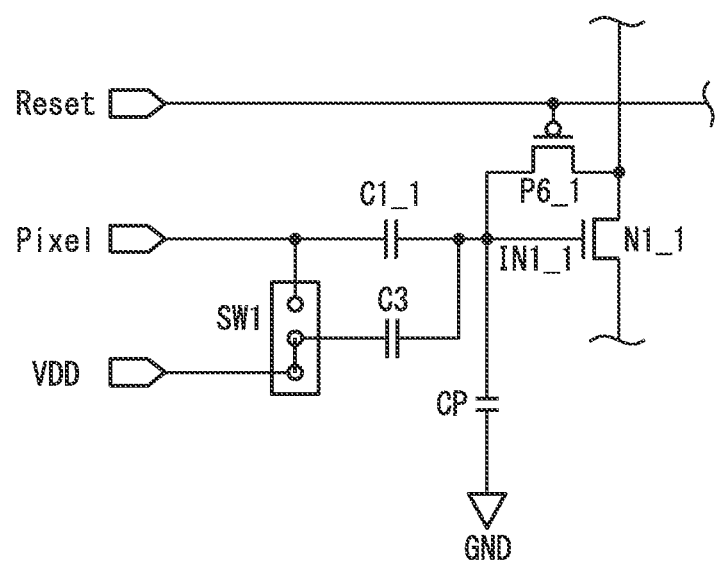
FIG. 12 is a diagram for explaining a voltage change in input terminals of a main comparison circuit provided in an AD conversion circuit in accordance with the third preferred embodiment of the present invention.

Then, after starting the generation of the ramp wave Ramp again, a signal level is applied to the first input terminal IN1_1 as the pixel signal Pixel. Hereinafter, using FIG. 12, the voltage $V_{IN1\_1}$ of the first input terminal IN1_1 at the time point (the time T4) at which the signal level has been input will be described. FIG. 12 illustrates only an extracted peripheral configuration of the first input terminal IN1_1. Hereinafter, the following description will be given on the assumption that there is parasitic capacitance CP between the first input terminal IN1_1 and the ground GND.

At the time point (the time T2) at which the other end of the capacitive element C3 has been connected to the capacitive element C1_1 by the switch element SW1, the voltage of the other end of the capacitive element C1_1, to which the reset level is applied as the pixel signal Pixel, is $V_R$. Furthermore, at the time point (the time T4) at which the signal level has been applied as the pixel signal Pixel, the voltage of the other end of the capacitive element C1_1 is $V_S$. When a change in the voltage of the other end of the capacitive element C1_1 from the time T2 to the time T4 is set as $\Delta V3$, $\Delta V3$ is expressed by the following Equation (10).

$$\Delta V3 = V_S - V_R \quad (10)$$

After the time T2, since the transistor P6_1 enters an OFF state, the amount of charge accumulated in the capacitive elements C1_1 and C3 and the parasitic capacitance CP is held. Accordingly, when a change in the voltage of the first input terminal IN1_1 from the time T2 to the time T4 is set as $\Delta V4$, $\Delta V4$ is expressed by the following Equation (11). Furthermore, the capacitive element C1_1 and the capacitive element C3 are connected in parallel to each other and a capacitance value obtained by synthesizing the capacitive element C1_1 with the capacitive element C3, which are connected in parallel to each other, is $C_C$ of Equation (11) below. Furthermore, in Equation (11) below, $C_P$ is a capacitance value of the parasitic capacitance CP.

$$\Delta V4 = \frac{C_C}{C_C + C_P} \times \Delta V3 \quad (11)$$

When $C_P$ is negligible compared to $C_C$ ($C_C \gg C_P$), $\Delta V4$ is equal to $\Delta V3$. Since the voltage of the first input terminal IN1_1 at the time T2 is expressed by Equation (8) above, the voltage $V_{IN1\_1}$ of the first input terminal IN1_1 at the time T4 is expressed by the following Equation (12).

$$\begin{aligned} V_{IN1\_1} &= V_{RST\_1} + \frac{C_3}{C_{1\_1} + C_3} \times (V_R - V_{DD}) + \Delta V4 \\ &= V_{RST\_1} + \frac{C_3}{C_{1\_1} + C_3} \times (V_R - V_{DD}) + \Delta V3 \\ &= V_{RST\_1} + \frac{C_3}{C_{1\_1} + C_3} \times (V_R - V_{DD}) + (V_S - V_R) \end{aligned} \quad (12)$$

Since $V_R < V_{DD}$ and $V_S \le V_R$, the voltage $V_{IN1\_1}$ (Equation (12) above) of the first input terminal IN1_1 at the time of the comparison start in the main comparison circuit CMP_1 according to the signal level is lower than the voltage $V_{IN2\_1}$ ($V_{RST\_1}$) of the second input terminal IN2_1.

At a predetermined timing after the time T4, the voltage of the ramp wave Ramp starts to be reduced. At the timing at which the voltage $V_{IN2\_1}$ of the second input terminal IN2_1, to which the ramp wave Ramp has been applied, approximately coincides with the voltage $V_{IN1\_1}$ of the first input terminal IN1_1 to which the signal level has been applied, the comparison output C0_1 of the main comparison circuit CMP_1 is inverted. At the time point (the time T5) at which a predetermined period has passed after the voltage of the ramp wave Ramp starts to be reduced, the reference signal generation unit 35 stops the generation of the ramp wave Ramp.

Next, the configuration of the sub-comparison circuit CMP_2 constituting the comparison unit 31 will be described. Since the configuration of the sub-comparison circuit CMP_2 is approximately the same as the configuration of the sub-comparison circuit CMP_2 illustrated in FIG. 8, a description thereof will be omitted here.

Furthermore, it is preferable that a capacitance value $C_{1\_2}$ of the capacitive element C1_2 of the sub-comparison circuit CMP_2 be approximately equal to a capacitance value ($C_{1\_1} + C_3$) of the sum of a capacitance value $C_{1\_1}$ of the capacitive element C1_1 of the main comparison circuit CMP_1 and a capacitance value $C_3$ of the capacitive element C3 such that the voltage $V_{IN2\_2}$ of the second input terminal IN2_2 of the sub-comparison circuit CMP_2, to which the ramp wave Ramp is applied, and the voltage $V_{IN2\_1}$ of the second input terminal IN2_1 of the main comparison circuit CMP_1 are changed with approximately the same inclination. However, the present invention is not limited to this configuration as long as the second timing is earlier than the first timing.

Hereinafter, an operation of the third preferred embodiment will be described. Furthermore, it is assumed that a reset level voltage applied as the pixel signal Pixel is set as $V_R$ and a signal level voltage applied as the pixel signal Pixel is set as $V_S$ ($V_S \le V_R$). Furthermore, it is assumed that a voltage of the ramp wave Ramp at a time t is set as $V_{Ramp}(t)$. A waveform of the ramp wave Ramp applied to the sub-comparison circuit CMP_2 from the reference signal generation unit 35 is the waveform illustrated in FIG. 5.

Figure 13B:
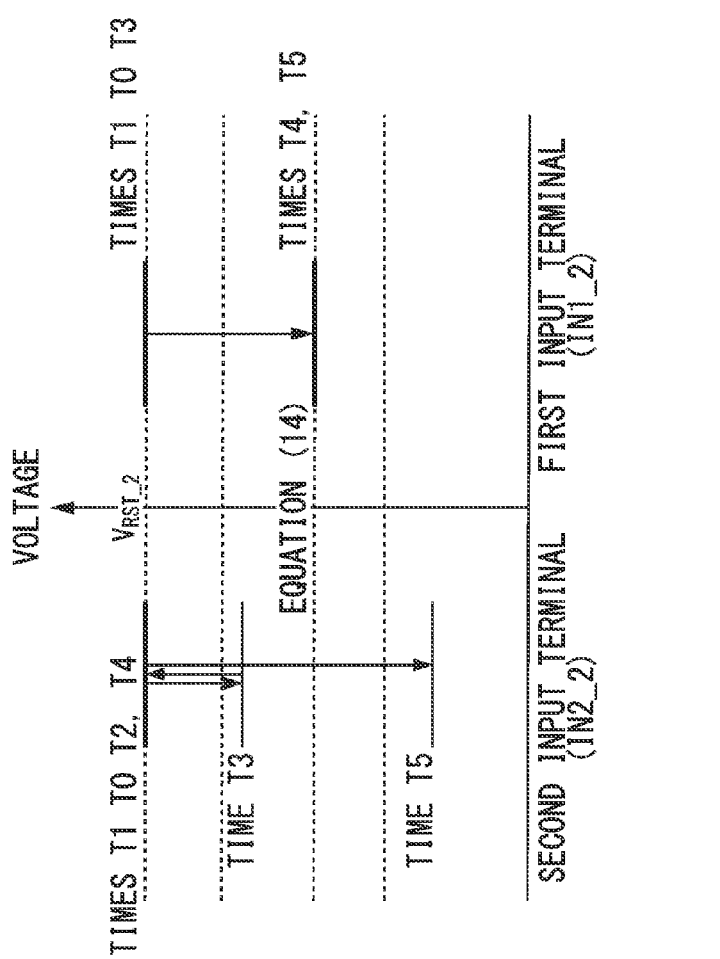
FIG. 13A and FIG. 13B are reference diagrams illustrating a voltage change in input terminals of a sub-comparison circuit provided in an AD conversion circuit in accordance with the third preferred embodiment of the present invention.
Figure 13A:
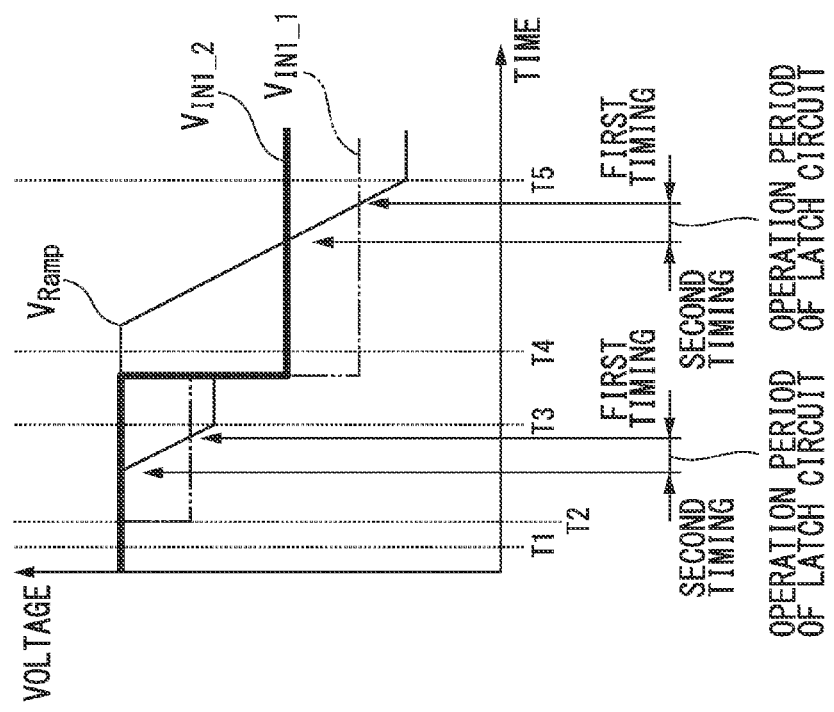

FIG. 13A and FIG. 13B illustrate a voltage change (FIG. 13A) in the first input terminal IN1_2 of the differential amplifier constituting the sub-comparison circuit CMP__2 and the first input terminal IN1__1 of the differential amplifier constituting the main comparison circuit CMP__1, and a voltage change (FIG. 13B) in the first input terminal IN1__2 and the second input terminal IN2__2 of the differential amplifier constituting the sub-comparison circuit CMP__2. In FIG. 13A, a horizontal axis denotes time and a vertical axis denotes voltage. In FIG. 13A, a thick solid line denotes the voltage $V_{IN1\_2}$ of the second input terminal IN1__2 of the differential amplifier constituting the sub-comparison circuit CMP__2, a thin solid line denotes the voltage $V_{Ramp}$ of the ramp wave Ramp applied to the second input terminal IN2__2, and a double dotted line denotes the voltage $V_{IN1\_1}$ of the first input terminal IN1__1 of the differential amplifier constituting the main comparison circuit CMP__1. In FIG. 13B, a vertical axis denotes voltage, a voltage change at the left side illustrates a change in the voltage $V_{IN2\_2}$ of the second input terminal IN2__2 constituting the sub-comparison circuit CMP__2, and a voltage change at the right side illustrates a change in the voltage $V_{IN1\_2}$ of the first input terminal IN1__2 constituting the sub-comparison circuit CMP__2.

After the reset level is applied to the first input terminal IN1__2 as the pixel signal Pixel and the ramp wave Ramp applied to the second input terminal IN2__2 is stabilized, the reset pulse Reset is activated (Low active state) before the comparison start in the sub-comparison circuit CMP__2. In this way, since the PMOS transistors P6__2 and P7__2 enter an ON state, the gates and the drains of the NMOS transistors N1__2 and N2__2 are short-circuited, so that the voltages of the two input terminals are reset by employing operating points of the NMOS transistors N1__2 and N2__2 as drain voltages.

At the operating points decided by the reset, the voltages of the two input terminals of the differential amplifier, that is, offset components of the gate voltages of the NMOS transistors N1__2 and N2__2, are approximately cancelled. That is, the voltages of the two input terminals of the differential amplifier are reset to be approximately the same voltage $V_{RST\_2}$. At this time point (the time T1), the voltage $V_{IN1\_2}$ of the first input terminal IN1__2 is $V_{RST\_2}$ and the voltage $V_{IN2\_2}$ of the second input terminal IN2__2 is $V_{RST\_2}$. After the reset, the PMOS transistors P6__2 and P7__2 enter an OFF state.

Then, in the main comparison circuit CMP__1, as described above, the voltage $V_{IN1\_1}$ of the first input terminal IN1__1, to which the reset level is applied as the pixel signal Pixel, is decreased to a predetermined voltage from the voltage $V_{RST\_1}$. At this time, in the sub-comparison circuit CMP__2, there is no change in the voltage $V_{IN1\_2}$ of the first input terminal IN1__2 to which the reset level is applied as the pixel signal Pixel. The voltage $V_{IN1\_2}$ of the first input terminal IN1__2 and the voltage $V_{IN2\_2}$ of the second input terminal IN2__2 at this time point (the time T2) are $V_{RST\_2}$.

At a predetermined timing after the time T2, the voltage of the ramp wave Ramp starts to be reduced. The voltage $V_{IN2\_2}$ of the second input terminal IN2__2 after the voltage of the ramp wave Ramp starts to be reduced is expressed by the following Equation (13).

$$V_{IN2\_2} = V_{RST\_2} + (V_{Ramp}(t) - V_{Ramp}(0)) \quad (13)$$

At the timing at which the voltage $V_{IN2\_2}$ of the second input terminal IN2__2, to which the ramp wave Ramp has been applied, approximately coincides with the voltage $V_{12}$ of the first input terminal IN1__2 to which the reset level has been applied, the comparison output C0__2 of the sub-comparison circuit CMP__2 is inverted. At the time point (the time T3) at which a predetermined period has passed after the voltage of the ramp wave Ramp starts to be reduced, the reference signal generation unit 35 stops the generation of the ramp wave Ramp.

Then, after starting the generation of the ramp wave Ramp again, a signal level is applied to the first input terminal IN1__2 as the pixel signal Pixel. At the time point (the time T2) at which the voltage $V_{IN1\_1}$ of the first input terminal IN1__1 of the main comparison circuit CMP__1 has decreased, the voltage of the other end of the capacitive element C1__2, to which the reset level has been applied as the pixel signal Pixel, is $V_R$. Furthermore, at the time point (the time T4) at which the signal level has been input as the pixel signal Pixel, the voltage of the other end of the capacitive element C1__2 is $V_S$. Consequently, the voltage $V_{IN1\_2}$ of the first input terminal IN1__2 at the time T4 is expressed by the following Equation (14).

$$V_{IN1\_2} = V_{RST\_2} + (V_S - V_R) \quad (14)$$

At the time T4, the voltage $V_{IN2\_2}$ of the second input terminal IN2__2, to which the ramp wave Ramp is applied, is $V_{RST\_2}$. At a predetermined timing after the time T4, the voltage of the ramp wave Ramp starts to be reduced. The voltage $V_{IN2\_2}$ of the second input terminal IN2__2 after the time point at which the voltage of the ramp wave Ramp has started to be reduced is expressed by the aforementioned Equation (13). At the timing at which the voltage $V_{IN2\_2}$ of the second input terminal IN2__2, to which the ramp wave Ramp has been applied, approximately coincides with the voltage $V_{IN1\_2}$ of the first input terminal IN1__2 to which the signal level has been applied, the comparison output C0__2 of the sub-comparison circuit CMP__2 is inverted. At the time point (the time T5) at which a predetermined period has passed after the voltage of the ramp wave Ramp starts to be reduced, the reference signal generation unit 35 stops the generation of the ramp wave Ramp.

As illustrated in FIGS. 11A, 11B, 13A, and 13B, the offset voltage $\Delta V_{OFFSET\_1}$ is applied to the voltage $V_{IN1\_1}$ of the first input terminal IN1__1 of the main comparison circuit CMP__1, so that the voltage $V_{IN1\_1}$ of the first input terminal IN1__1 of the main comparison circuit CMP__1 is lower than the voltage $V_{IN1\_2}$ of the first input terminal IN1__2 of the sub-comparison circuit CMP__2 during the comparison operation period in the comparison unit 31 according to the reset level and the signal level. In this way, it is possible to allow the first timing, at which the comparison output C0__1 of the main comparison circuit CMP__1 is inverted, to be later than the second timing at which the comparison output C0__2 of the sub-comparison circuit CMP__2 is inverted.

As described above, according to the third preferred embodiment, even in the case of using the same ramp wave Ramp, it is possible to apply the offset voltage such that the voltage of the first input terminal IN1__1 of the main comparison circuit CMP__1 constituting the comparison unit 31 is different from the voltage of the first input terminal IN1__2 of the sub-comparison circuit CMP__2 constituting the comparison unit 31. In this way, it is possible to easily allow the first timing to be later than the second timing, so that it is possible to suppress the reduction of AD conversion accuracy as described in the first preferred embodiment.

Fourth Preferred Embodiment

Next, a fourth preferred embodiment of the present invention will be described. The difference from the first preferred embodiment is the configuration and the operation of the reference signal generation unit 35. The reference signal generation unit 35 generates a first ramp wave Ramp__1 and outputs the first ramp wave Ramp__1 to the main comparison circuit CMP__1 of the comparison unit 31, and generates a second ramp wave Ramp__2 and outputs the second ramp wave Ramp__2 to the sub-comparison circuit CMP__2 of the comparison unit 31. The first ramp wave Ramp__1 and the second ramp wave Ramp__2 are ramp waves having approximately the same inclination. However, a timing at which the voltage of the second ramp wave Ramp__2 starts to be reduced is earlier than a timing at which the voltage of the first ramp wave Ramp__1 starts to be reduced. Since configurations other than the reference signal generation unit 35 are approximately the same as the configurations in the first preferred embodiment, a description thereof will be omitted here.

Next, a detailed operation of the fourth preferred embodiment will be described. FIG. 14 illustrates the operation of the AD conversion circuit in accordance with the fourth preferred embodiment. In FIG. 14, $V_{IN1\_1}$ indicates a voltage of a first input terminal of the main comparison circuit CMP__1 to which the analog signal Signal is input, $V_{IN2\_1}$ indicates a voltage of a second input terminal of the main comparison circuit CMP__1 to which the ramp wave Ramp is input, $V_{IN1\_2}$ indicates a voltage of a first input terminal of the sub-comparison circuit CMP__2 to which the analog signal Signal is input, and $V_{IN2\_2}$ indicates a voltage of a second input terminal of the sub-comparison circuit CMP__2 to which the ramp wave Ramp is input. Furthermore, in FIG. 14, Q0 to Q7 indicate signals that are output from the latch circuits L__0 to L__7 of the latch unit 33.

First, the analog signal Signal to be subjected to AD conversion and the first ramp wave Ramp__1 and the second ramp wave Ramp__2, which reduce with the passage of time, are input to the main comparison circuit CMP__1 and the sub-comparison circuit CMP__2 constituting the comparison unit 31. Then, a reset operation (auto-zero) of the main comparison circuit CMP__1 and the sub-comparison circuit CMP__2 are performed. Furthermore, it is preferable that an offset be added to at least the main comparison circuit CMP__1.

Next, a start pulse StartP is shifted from an L state to an H state, so that the delay units DU[0] to DU[7] of the clock generation unit 30 start to operate. The delay unit DU[0] constituting the clock generation unit 30 delays the start pulse StartP and outputs the output clock CK[0], and the delay units DU[1] to DU[7] constituting the clock generation unit 30 delay output signals of delay units of a previous stage and output the output clocks CK[1] to CK[7], respectively. The output clocks CK[0] to CK[7] of the delay units DU[0] to DU[7] are input to the latch circuits L__0 to L__7 of the latch unit 33.

Almost at the same time as the start of the operation of the delay units DU[0] to DU[7], the voltage of the second ramp wave Ramp__2 input to the sub-comparison circuit CMP__2 starts to be reduced, and the main comparison circuit CMP__1 and the sub-comparison circuit CMP__2 start a comparison operation. The comparison outputs C0__1 and C0__2 at the time point at which the main comparison circuit CMP__1 and the sub-comparison circuit CMP__2 have started the comparison operation are in an L state. Furthermore, the control signal Enable is in an H state. At this time point, since the control signal Hold_L is in an L state and the control signal Hold_C is in an H state, the latch circuits L__0 to L__6 enter a disable state and the latch circuit L__7 enters an enable state. The latch circuit L__7 outputs the received output clock CK[7] of the delay unit DU[7] to the counting unit 34 without change.

The counting unit 34 performs a counting operation based on the output clock CK[7]. In this counting operation, a count value increases or decreases with the rise or fall of the output clock CK[7]. After the voltage of the second ramp wave Ramp__2 input to the sub-comparison circuit CMP__2 starts to be reduced and a predetermined time lapses, the voltage of the first ramp wave Ramp__1 input to the main comparison circuit CMP__1 starts to be reduced.

Then, in the sub-comparison circuit CMP__2, the voltages of the analog signal Signal and the second ramp wave Ramp__2 approximately coincide with each other, so that the comparison output C0__2 is inverted from an L state to an H state. At this time point (the second timing), since the control signal Hold_L is in an H state and the control signal Hold_C is in an H state, the latch circuits L__0 to L__7 enter an enable state.

Then, in the main comparison circuit CMP__1, the voltages of the analog signal Signal and the first ramp wave Ramp__1 approximately coincide with each other, so that the comparison output C0__1 is inverted from an L state to an H state. At this time point (the first timing), since the control signal Hold_L is in an L state and the control signal Hold_C is in an L state, the latch circuits L__0 to L__7 enter a disable state. In this way, the latch circuits L__0 to L__7 latch the logical states of the output clocks CK[0] to CK[7] that are lower phase signals from the delay units DU[0] to DU[7]. The counting unit 34 latches the count value when the latch circuit L__7 of the latch unit 33 stops. According to the logical state latched by the latch unit 33 and the count value latched by the counting unit 34, digital data corresponding to the analog signal Signal is obtained. Data latched in the latch circuits L__0 to L__7 is output to a circuit of a next stage, and is subjected to processing such as binarization (encoding) and the like.

In the operations described above, since the latch circuits L__0 to L__6 operate only in the period from the second timing to the first timing, it is possible to reduce current consumption in the latch unit 33.

Furthermore, in the fourth preferred embodiment, the operations of the latch circuits L__0 to L__6 constituting the latch unit 33 are controlled using the first lower phase signal as the output clocks CK[0] to CK[6] of the clock generation unit 30, so that low current consumption is achieved. However, for example, the same control as the control for the latch circuits L__0 to L__6 may be performed for the latch circuits L__0 to L__5 using the first lower phase signal as the output clocks CK[0] to CK[5] of the clock generation unit 30. Furthermore, the present invention is not limited thereto.

As described above, according to the fourth preferred embodiment, it is not necessary to provide the latch control unit including the inversion delay circuit as with the related art. Accordingly, it is possible to reduce transient bounce of power and ground due to power concentration. In this way, it is possible to suppress the reduction of AD conversion accuracy. Furthermore, the sub-comparison circuit is provided and causes an increase in current consumption. However, since current consumption of the sub-comparison circuit is small and it is also possible to operate the sub-comparison circuit only in the AD conversion period, an increase in current consumption in the comparison unit 31 is minimal.

Fifth Preferred Embodiment

Figure 15:
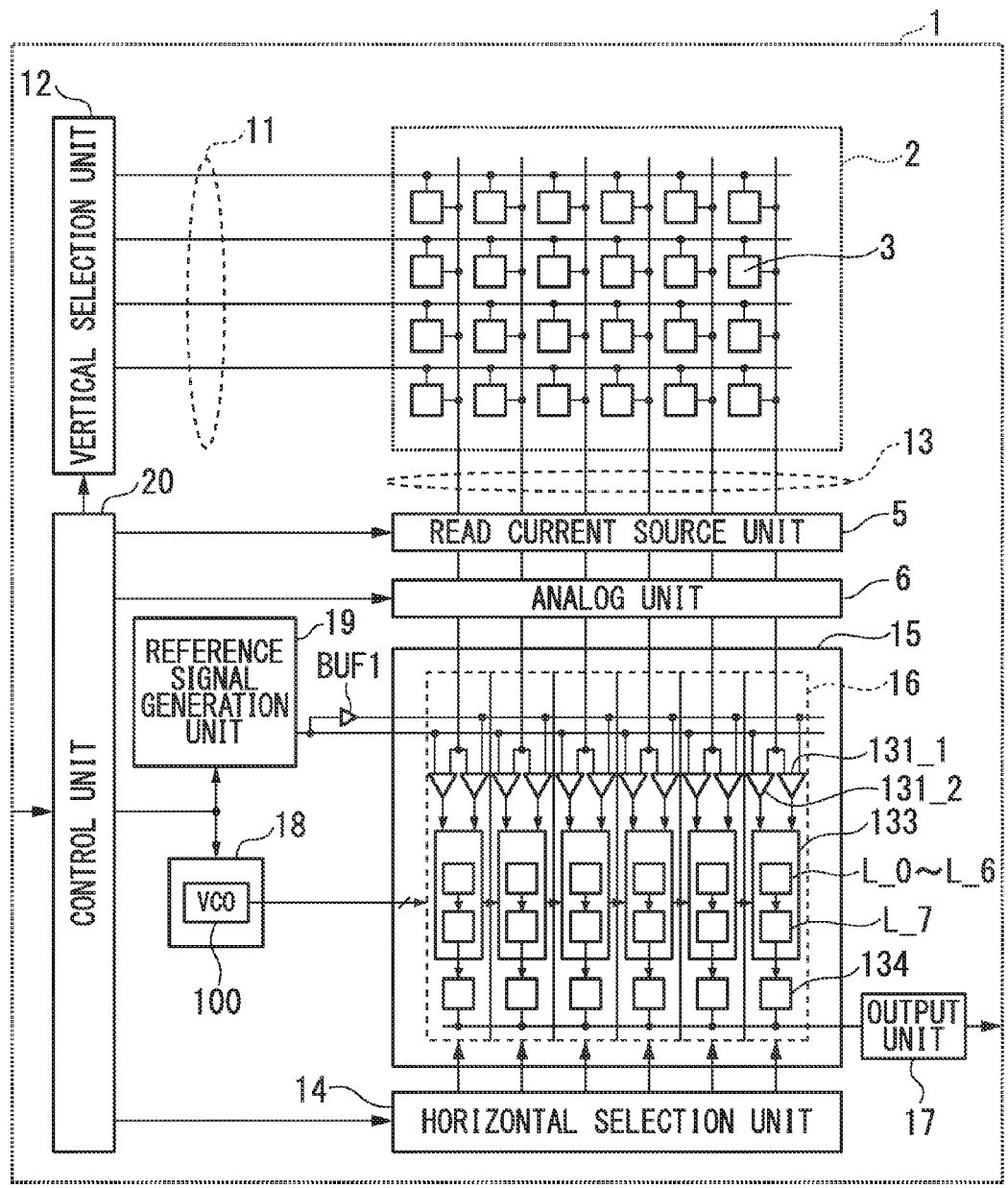
FIG. 15 is a block diagram illustrating the configuration of a solid-state image pickup device in accordance with a fifth preferred embodiment of the present invention.

Next, a fifth preferred embodiment of the present invention will be described. In the fifth preferred embodiment, a solid-state image pickup device employing the AD conversion circuit described in the fourth preferred embodiment will be described. FIG. 15 illustrates an example of the configuration of a solid-state image pickup device in accordance with the fifth preferred embodiment. A solid-state image pickup device 1 illustrated in FIG. 15 includes an image capturing unit 2, a vertical selection unit 12, a read current source unit 5, an analog unit 6, a clock generation unit 18, a reference signal generation unit 19, a column processing unit 15, a horizontal selection unit 14, an output unit 17, and a control unit 20.

The image capturing unit 2 includes a plurality of unit pixels 3 that are arranged in a matrix form and generate and output a signal corresponding to the amount of incident light. The vertical selection unit 12 selects each row of the image capturing unit 2. The read current source unit 5 reads a signal from the image capturing unit 2 as a voltage signal. The analog unit 6 performs analog processing on a pixel signal read from the image capturing unit 2. The clock generation unit 18 generates and outputs a clock signal with a predetermined frequency. The reference signal generation unit 19 generates a reference signal (a ramp wave) that increases or decreases with the passage of time. The column processing unit 15 is connected to the reference signal generation unit 19 through a reference signal line.

The horizontal selection unit 14 reads AD converted data to a horizontal signal line. The output unit 17 is connected to the horizontal signal line. The control unit 20 controls each of the elements.

In FIG. 15, a description in which the image capturing unit 2 includes unit pixels 3 of 4 rows×6 columns was provided for simplification. However, actually, several tens to several tens of thousands of unit pixels 3 are arranged in each row and each column of the image capturing unit 2. Furthermore, although not illustrated in the drawing, each unit pixel 3 constituting the image capturing unit 2 includes a photoelectric conversion element such as a photodiode, a photogate, or a phototransistor, and a transistor circuit.

Hereinafter, each of the elements will be described in detail. In the image capturing unit 2, the unit pixels 3 of 4 rows×6 columns are arranged in a two-dimensional manner, and a row control line 11 is provided for each row with respect to the pixel arrangement of 4 rows×6 columns. Each one end of the row control lines 11 is connected to an output terminal corresponding to a row of the vertical selection unit 12. The vertical selection unit 12 includes a shift register, a decoder and the like, and controls row addresses and row scanning of the image capturing unit 2 through the row control lines 11 when each unit pixel 3 of the image capturing unit 2 is driven. Furthermore, a vertical signal line 13 is provided for each column with respect to the pixel arrangement of the image capturing unit 2.

The read current source unit 5, for example, includes NMOS transistors. The vertical signal lines 13 from the image capturing unit 2 are connected to drain terminals of the NMOS transistors constituting the read current source unit 5, a desired voltage is appropriately applied to control terminals of the NMOS transistors, and source terminals of the NMOS transistors are connected to the ground GND. In this way, a signal from the unit pixel 3 is output as a voltage mode. Furthermore, the case in which the NMOS transistor is used as a current source is described. However, the present invention is not limited thereto.

A detailed description of the analog unit 6 will be omitted. However, the analog unit 6 performs a process of obtaining a difference between a signal level (a reset level) immediately after pixel reset and a true signal level with respect to a pixel signal of the voltage mode, which has been input through the vertical signal line 13, thereby removing a noise component called FPN (=Fixed Pattern Noise), which is a fixed variation in each pixel, or reset noise. Furthermore, a PGA (=Programmable Gain Amplifier) circuit and the like, which have a signal amplification function, may also be provided according to necessity.

The column processing unit 15, for example, has a column AD conversion section 16 provided for each pixel array of the image capturing unit 2, that is, each vertical signal line 13, and converts an analog pixel signal, which is read from each unit pixel 3 of the image capturing unit 2 through the vertical signal line 13 every pixel array, into digital data. Furthermore, the fifth preferred embodiment has a configuration in which the column AD conversion sections 16 are arranged for the pixel arrays of the image capturing unit 2 in a one-to-one fashion. However, this is for illustrative purposes only and the present invention is not limited to the arrangement relation. For example, it may be possible to employ a configuration in which one column AD conversion section 16 is arranged for a plurality of pixel arrays, and is used among the plurality of pixel arrays in a time division manner. The column processing unit 15 constitutes an analog-to-digital conversion means (an AD conversion circuit), which converts an analog pixel signal read from the unit pixel 3 of a selected pixel row of the image capturing unit 2, into digital pixel data, together with the reference signal generation unit 19 and the clock generation unit 18.

The reference signal generation unit 19, for example, includes an integration circuit, generates a so-called ramp wave, which has a level varying inclinedly with the passage of time, and supplies the ramp wave to one of input terminals of a comparison part 131 through the reference signal line under the control of the control unit 20. Furthermore, the reference signal generation unit 19 is not limited to a unit using the integration circuit. For example, the reference signal generation unit 19 may use a DAC circuit. However, in the case of employing a configuration in which the ramp wave is generated using the DAC circuit in a digital manner, it is necessary to allow steps of the ramp wave to be fine, or to employ a configuration equivalent thereto.

The horizontal selection unit 14 includes a shift register, a decoder and the like, and controls column address and column scanning of the column AD conversion section 16 of the column processing unit 15. Under the control of the horizontal selection unit 14, the AD converted digital data in the column AD conversion section 16 is sequentially read to the horizontal signal line.

The clock generation unit 18 includes a VCO 100 in which a plurality of delay units (inversion elements) are connected to one another, and outputs a clock signal with a constant phase difference from each delay unit. In the fifth preferred embodiment, as an example, the VCO 100 has the delay units DU[0] to DU[7] illustrated in FIG. 1 and outputs the output clocks CK[0] to CK[7] as clock signals. The VCO 100 may be a symmetrical oscillation circuit that is a ring-like delay circuit in which a plurality of delay units are connected to one another in a ring-like shape. Alternatively, the VCO 100 may be a ring-like delay circuit including an odd number of delay units, similarly to the symmetrical oscillation circuit. However, the VCO 100 may use a so-called "asymmetrical oscillation circuit" in which output is equivalently an even number (particularly, a power of 2).

The output unit 17 performs an encoding process such as binarization based on the digital data that is input from the horizontal signal line, and outputs binarized digital data. Furthermore, the output unit 17, for example, may have a signal processing function including black level adjustment, column variation correction, color processing and the like. Moreover, the output unit 17 may convert n-bit parallel digital data to serial data and output the serial data.

The control unit 20 has a functional unit of a TG (=Timing Generator) that supplies a clock or a pulse signal of a predetermined timing, which is required for the operations of the reference signal generation unit 19, the clock generation unit 18, the vertical selection unit 12, the horizontal selection unit 14, the output unit 17 and the like, and a functional unit for communicating with the TG. Furthermore, the control unit 20 may be provided as a separate semiconductor integrated circuit, independent of other functional elements of the image capturing unit 2, the vertical selection unit 12, the horizontal selection unit 14 and the like.

Next, the configuration of the column AD conversion section 16 will be described. Each column AD conversion section 16 compares the analog pixel signal, which is read from each unit pixel 3 of the image capturing unit 2 through the vertical signal line 13, with the ramp wave applied from the reference signal generation unit 19, thereby generating a time interval having a magnitude (a pulse width) in the time axis direction corresponding to a magnitude of the pixel signal. Then, the column AD conversion section 16 performs AD conversion using data which corresponds to the time interval as digital data corresponding to the magnitude of the pixel signal.

Hereinafter, details of the configuration of the column AD conversion section 16 will be described. The column AD conversion section 16 is provided for each column, and in FIG. 15, six column AD conversion sections 16 are provided. The column AD conversion sections 16 provided for the columns have the same configuration. Each column AD conversion section 16 includes the comparison part 131, a latch part 133, and a column counter 134 (a counting part). Here, as the column counter 134, a counter circuit having a latch function of holding a count value is considered.

The comparison part 131 has a main comparison circuit 131_1 and a sub-comparison circuit 131_2. The main comparison circuit 131_1 receives a signal obtained by delaying the ramp wave from the reference signal generation unit 19 by a buffer circuit BUF1, and the sub-comparison circuit 131_2 receives the ramp wave from the reference signal generation unit 19. Furthermore, the reference signal generation unit 19 and the buffer circuit BUF1 correspond to the reference signal generation unit 35 in the fourth preferred embodiment. The comparison part 131 compares a signal voltage which corresponds to the analog pixel signal output from the unit pixel 3 of the image capturing unit 2 through the vertical signal line 13 with a ramp voltage of the ramp wave, thereby converting the magnitude of the pixel signal to a first time interval (a pulse width of the pulse signal) and a second time interval, which are information in the time axis direction. Comparison output of the comparison part 131, for example, is at a Low level (L level) when the ramp voltage is larger than the signal voltage, and is at a High level (H level) when the ramp voltage is equal to or less than the signal voltage.

The latch part 133 includes latch circuits L_0 to L_7 that latch (hold/store) the logical states of the output clocks CK[0] to CK[7] that are output from the VCO 100. Based on the logical states of the output clocks CK[0] to CK[7] latched in the latch part 133, the output unit 17 performs encoding, so that data (lower data) of a lower bit, which constitutes digital data, is obtained.

The column counter 134 performs counting based on the output clock CK[7] from the VCO 100. The column counter 134 performs the counting so that data (upper data) of an upper bit, which constitutes the digital data, is obtained.

Furthermore, a signal corresponding to the logical states of the output clocks CK[0] to CK[7] latched in the latch part 133, for example, is 8 bit-data. Furthermore, an upper data signal constituting a count value of the column counter 134, for example, is 10 bit-data. Furthermore, 10 bits is an example, and the bit number may be fewer than 10 bits (for example, 8 bits), greater than 10 bits (for example, 12 bits), and the like.

Next, an operation of the fifth preferred embodiment will be described. Hereinafter, a description of a detailed operation of the unit pixel 3 will be omitted. However, as is well known in the art, the unit pixel 3 outputs a reset level and a signal level.

The AD conversion is performed as follows. For example, a voltage of a ramp wave that decreases with a predetermined inclination is compared with a voltage of the analog signal from the analog unit 6, the length of a period from the time point at which the comparison process has started to the time point at which the voltage of the analog signal coincides with the voltage (the ramp voltage) of the ramp wave in the main comparison circuit 131_1 is measured by the count value of the column counter 134 and encoding values of the logical states of the output clocks CK[0] to CK[7] latched in the latch part 133, so that digital data corresponding to the magnitude of the analog signal is obtained.

First, after a pixel signal output to the vertical signal line 13 from the unit pixel 3 of an arbitrary pixel row is stabilized, the control unit 20 supplies the reference signal generation unit 19 with control data for generating a ramp wave. In response to the control data, the reference signal generation unit 19 outputs a ramp wave, which has a waveform temporally varying in a ramp shape as a whole, as a comparison voltage to be applied to the comparison part 131. The main comparison circuit 131_1 of the comparison part 131 compares a signal obtained by delaying the ramp wave in the buffer circuit BUF1 with the analog signal from the analog unit 6, and the sub-comparison circuit 131_2 of the comparison part 131 compares the ramp wave with the analog signal from the analog unit 6. In this period, the column counter 134 performs counting using the output clock CK[7], which is output from the latch circuit L_7 of the latch part 133, as a counting clock.

When the voltage of the ramp wave applied from the reference signal generation unit 19 approximately coincides with the voltage of the analog signal from the analog unit 6, the sub-comparison circuit 131_2 of the comparison part 131 inverts comparison output.

At this timing (a second timing), the latch circuits L_0 to L_6 of the latch part 133 enter an enable state. Then, when a voltage of a signal obtained by delaying the ramp wave applied from the reference signal generation unit 19 by the buffer circuit BUF1 approximately coincides with the voltage of the analog signal from the analog unit 6, the main comparison circuit 131_1 of the comparison part 131 inverts comparison output. At this timing (a first timing), the latch circuits L_0 to L_7 of the latch part 133 enter a disable state, so that the latch part 133 latches the logical states of the output clocks CK[0] to CK[7] that are output from the clock generation unit 18. Furthermore, when the latch circuit L_7 of the latch part 133 stops the output of the output clock CK[7], the column counter 134 latches a count value. When a predetermined period passes, the control unit 20 stops the supply of the control data to the reference signal generation unit 19 and the output of the output clock from the clock generation unit 18. In this way, the reference signal generation unit 19 stops the generation of the ramp wave.

Lower data signals, which correspond to the logical states of the output clocks CK[0] to CK[7] latched by the latch part 133, and an upper data signal, which corresponds to the count value latched by the column counter 134, are transmitted from the horizontal selection unit 14 to the output unit 17 through the horizontal signal line. The output unit 17 performs an encoding process based on the lower data signals and the upper data signal, so that digital data of a signal component is obtained. Furthermore, the output unit 17 may be embedded in the column processing unit 15.

Furthermore, it may be possible to employ a configuration in which a reset level is read from each unit pixel 3 of a selected row of the image capturing unit 2 through a first read operation so as to be subjected to AD conversion, a signal level is read through a second read operation so as to be subjected to AD conversion, and then the reset level and the signal level are subjected to a CDS (=Correlated Double Sampling) process in a digital manner, so that digital data corresponding to a pixel signal is obtained. Furthermore, the present invention is not limited thereto. Furthermore, the AD conversion circuit described in the first to third preferred embodiments may be applied to the solid-state image pickup device.

As described above, according to the fifth preferred embodiment, in the solid-state image pickup device, it is possible to reduce the deterioration of AD conversion accuracy while reducing current consumption, resulting in the achievement of high image quality.

Sixth Preferred Embodiment

Figure 16:
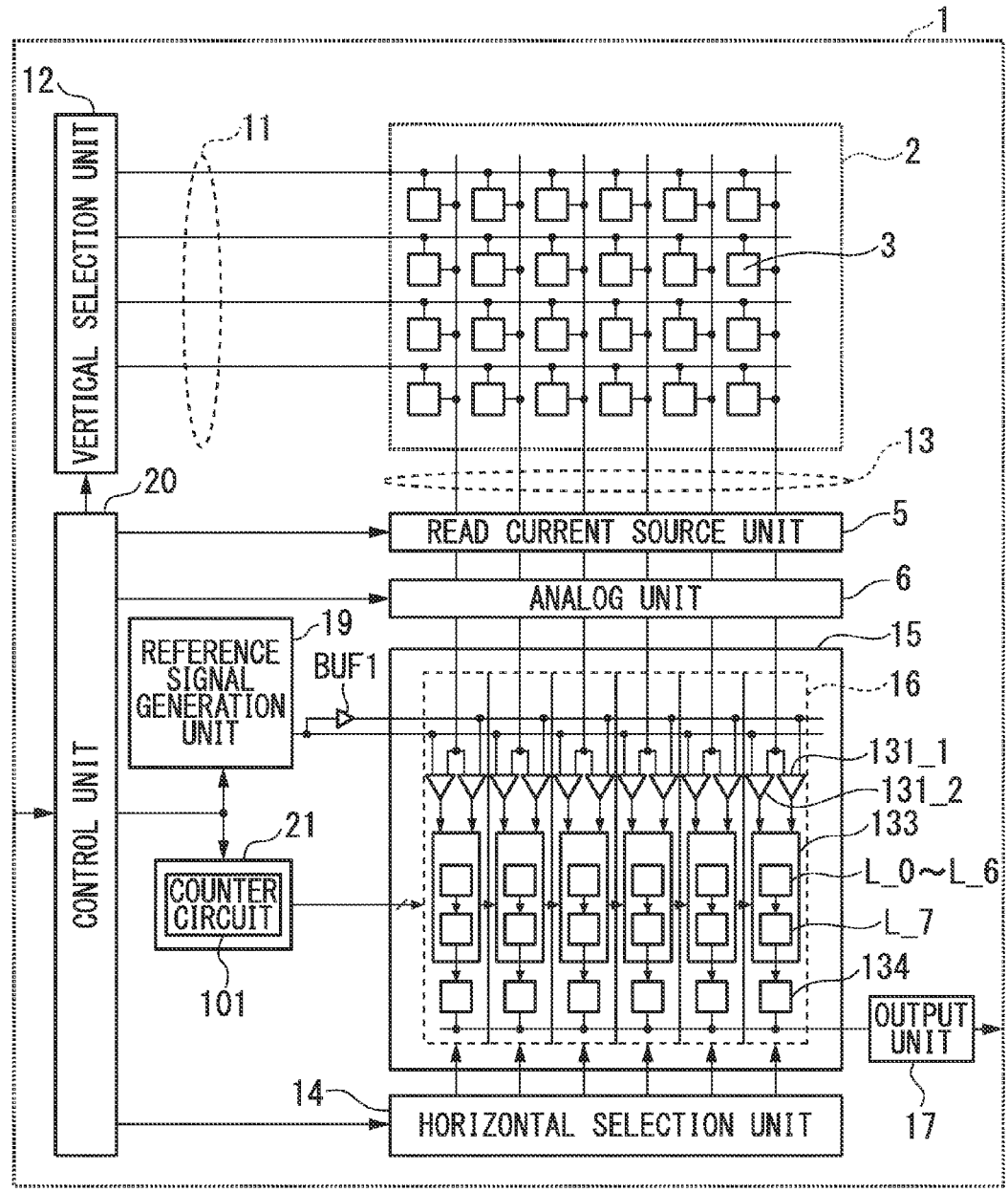
FIG. 16 is a block diagram illustrating the configuration of a solid-state image pickup device in accordance with a sixth preferred embodiment of the present invention.

Next, a sixth preferred embodiment of the present invention will be described. FIG. 16 illustrates an example of the configuration of a solid-state image pickup device in accordance with the sixth preferred embodiment. Hereinafter, parts different from the fifth preferred embodiment will be described. In the sixth preferred embodiment, a counting unit 21 is provided instead of the clock generation unit 18 in the fifth preferred embodiment. The counting unit 21 has a counter circuit 101. The counter circuit 101, for example, includes a binary counter circuit, performs counting of a clock signal with a predetermined frequency, and outputs a count value (a lower count value). Since configurations other than the counting unit 21 are approximately the same as the configurations in the fifth preferred embodiment, a description thereof will be omitted.

Figure 17:
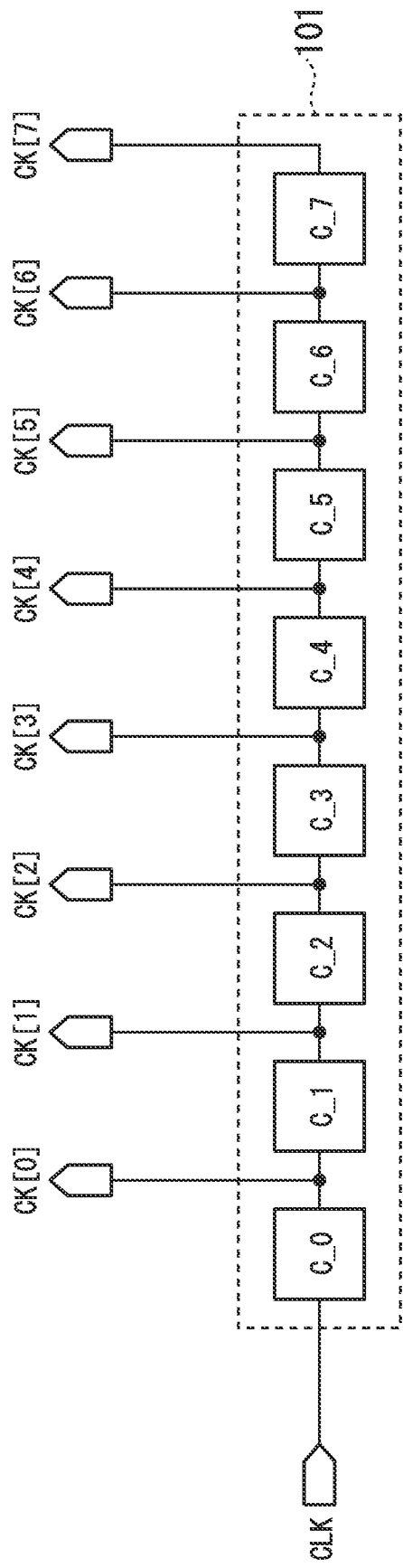
FIG. 17 is a block diagram illustrating the configuration of a counter circuit provided in a solid-state image pickup device in accordance with the sixth preferred embodiment of the present invention.
Figure 18:
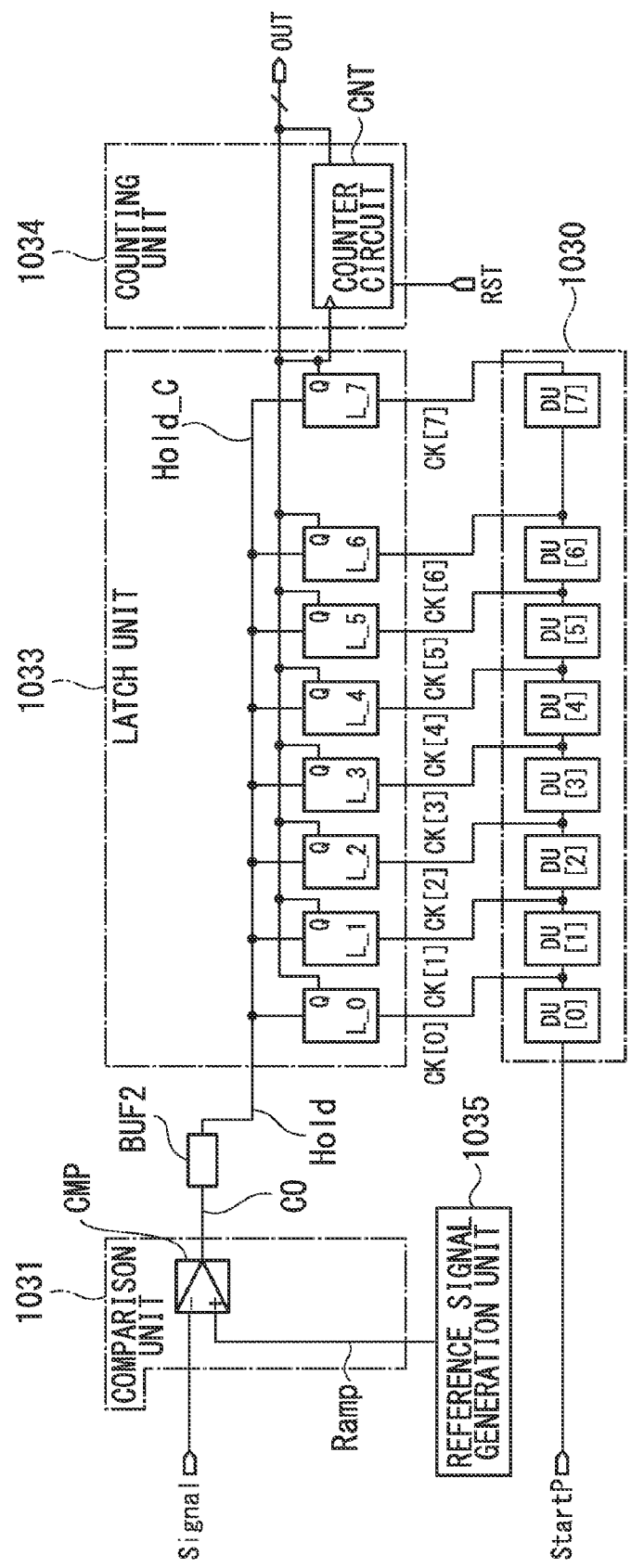
FIG. 18 is a circuit diagram illustrating the configuration of an AD conversion circuit in accordance with the related art.
Figure 19:
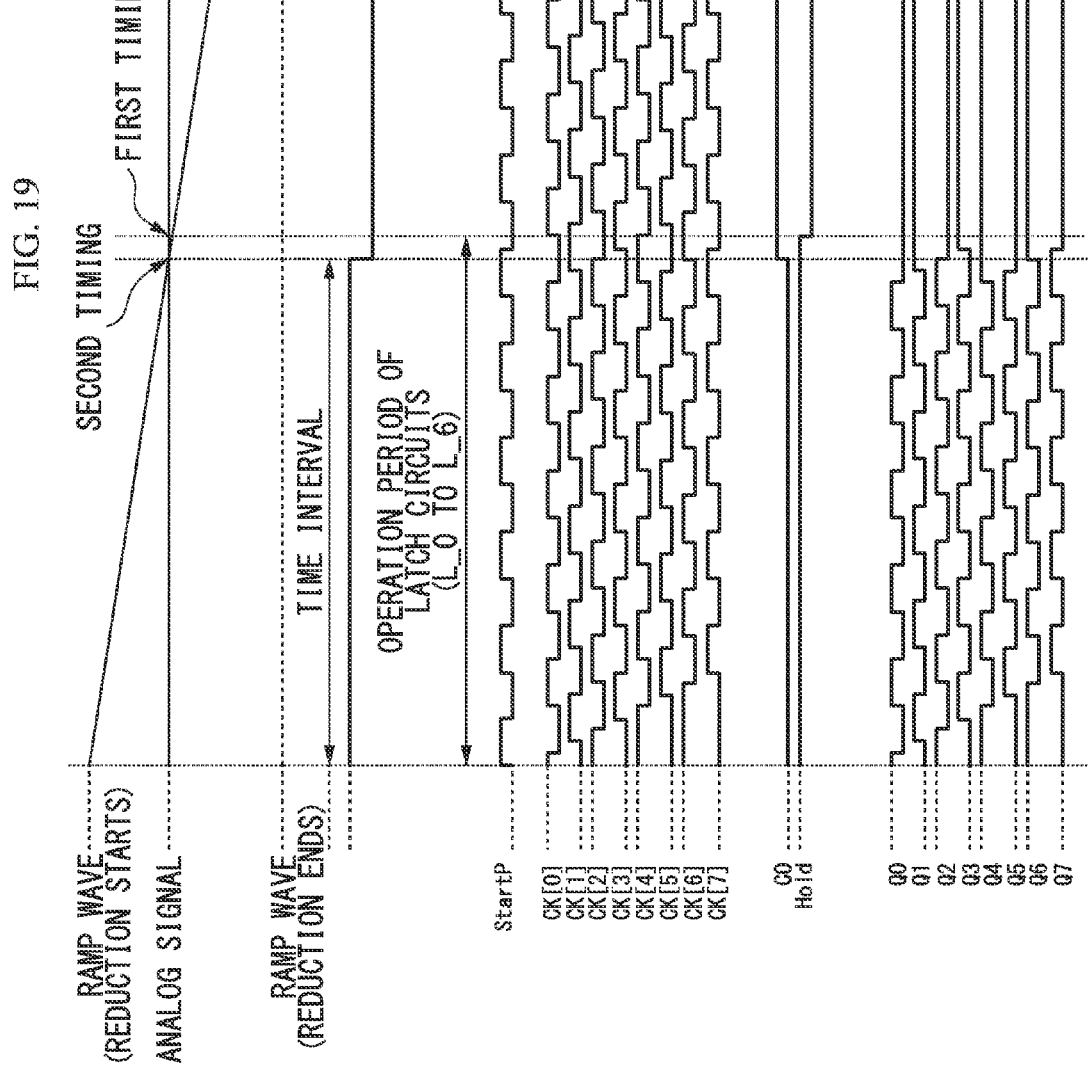
FIG. 19 is a timing chart illustrating the operation of an AD conversion circuit in accordance with the related art.

FIG. 17 illustrates an example of the configuration of the counter circuit 101. The counter circuit 101 has 8-bit counter circuits C_0 to C_7 that output count values CK[0] to CK[7]. The counter circuit C_0 receives a clock signal CLK, and the counter circuits C_1 to C_7 receive count values of counter circuits of a previous stage. The counter circuit C_0 performs counting in response to a change in the clock signal CLK, and the counter circuits C_1 to C_7 perform counting in response to a change in the count values of the counter circuits of the previous stage. The count values CK[0] to CK[6] (a first lower phase signal) of the counter circuits C_0 to C_6 corresponding to lower bits are output to the latch circuits L_0 to L_6 (a first latch circuit) of the latch part 133. The count value CK[7] (a second lower phase signal) of the counter circuit C_7 corresponding to an upper bit is output to the latch circuit L_7 (a second latch circuit) of the latch part 133.

Furthermore, the counting unit 21 may include a circuit other than the binary counter circuit. Moreover, it is preferable that a synchronous counter circuit be used as the counter circuit constituting the counting unit 21. However, the present invention is not limited thereto.

Since the operation of the sixth preferred embodiment is the same as the operation described in the fifth preferred embodiment except that the count values CK[0] to CK[7] correspond to the output clocks CK[0] to CK[7] in the fifth preferred embodiment, a description thereof will be omitted.

As described above, according to the sixth preferred embodiment, in the solid-state image pickup device, it is possible to reduce the deterioration of AD conversion accuracy while reducing current consumption, resulting in the achievement of high image quality.

The aforementioned preferred embodiment has described the example in which the reference signal (the ramp wave) decreases with the passage of time. However, the present invention can also be applied to the case in which the reference signal increases with the passage of time.

The present invention provides an AD conversion circuit and an image pickup device capable of reducing the deterioration of AD conversion accuracy while reducing current consumption.

According to a preferred embodiment of the present invention, after the second latch circuit becomes valid, the first latch circuit becomes valid at a timing according to the second timing, so that it is possible allow an operation period of the first latch circuit to be shorter than an operation period of the second latch circuit, resulting in the reduction of current consumption. Furthermore, the first timing and the second timing are generated by the operations of the first comparison circuit and the second comparison circuit, so that it is not necessary to provide a latch control unit as in the related art, thereby reducing the deterioration of AD conversion accuracy.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. An AD conversion circuit comprising:
   a reference signal generation unit configured to generate a reference signal increasing or decreasing with passage of time;
   a comparison unit that includes a first comparison circuit and a second comparison circuit, each of which compares an analog signal to be subjected to an AD conversion with the reference signal;
   a clock generation unit that includes a delay circuit in which a plurality of delay units are connected to one another, the clock generation unit outputting a first lower phase signal and a second lower phase signal based on clock signals that are output from each of the plurality of delay units;
   a latch unit that includes a first latch circuit and a second latch circuit, the first latch circuit being configured to latch a logical state of the first lower phase signal that is output from the clock generation unit, the second latch circuit being configured to latch a logical state of the second lower phase signal that is output from the clock generation unit; and
   a counting unit configured to perform counting based on the second lower phase signal that is output from the clock generation unit, wherein
   the first comparison circuit is configured to complete a first comparison process at a first timing at which the reference signal satisfies a predetermined condition with respect to the analog signal, the second comparison circuit is configured to determine a second timing corresponding to a magnitude of the analog signal, the first timing is later than the second timing, the latch unit is configured to make the second latch circuit, to which the second lower phase signal is input, valid, and then make the first latch circuit, to which the first lower phase signal is input, valid at a timing according to the second timing, and the latch unit is configured to latch the first lower phase signal through the first latch circuit and the second lower phase signal through the second latch circuit at a timing according to the first timing.

2. An AD conversion circuit comprising:

a reference signal generation unit configured to generate a reference signal increasing or decreasing with passage of time;

a comparison unit that includes a first comparison circuit and a second comparison circuit, each of which compares an analog signal to be subjected to an AD conversion with the reference signal;

a counting unit configured to perform a counting by using a clock signal with a predetermined frequency as a counting clock so as to generate a lower count value, the counting unit being configured to output a first lower phase signal including a first bit signal constituting the lower count value and a second lower phase signal including a second bit signal constituting the lower count value; and a latch unit that includes a first latch circuit that latches a logical state of the first lower phase signal that is output from the counting unit, and a second latch circuit that latches a logical state of the second lower phase signal, wherein the first comparison circuit is configured to complete a first comparison process at a first timing at which the reference signal satisfies a predetermined condition with respect to the analog signal, the second comparison circuit is configured to decide a second timing corresponding to a magnitude of the analog signal, the first timing is later than the second timing, the latch unit is configured to make the second latch circuit, to which the second lower phase signal is input, valid, and then make the first latch circuit, to which the first lower phase signal is input, valid at a timing according to the second timing, and the latch unit is configured to latch the first lower phase signal through the first latch circuit and the second lower phase signal through the second latch circuit at a timing according to the first timing.

3. The AD conversion circuit according to claim 2, further comprising:

a second counting unit configured to perform counting by using one bit signal, which constitutes the second lower phase signal that is output from the counting unit, as a counting clock.

4. The AD conversion circuit according to claim 1, wherein the second timing is a timing at which the reference signal satisfies a predetermined condition with respect to the analog signal.

5. The AD conversion circuit according to claim 2, wherein the second timing is a timing at which the reference signal satisfies a predetermined condition with respect to the analog signal.

6. The AD conversion circuit according to claim 3, wherein the second timing is a timing at which the reference signal satisfies a predetermined condition with respect to the analog signal.

7. The AD conversion circuit according to claim 4, wherein the first comparison circuit is configured to apply an offset voltage to at least one of a first input terminal to which the analog signal is input and a second input terminal to which the reference signal is input, so as to make the first timing later than the second timing.

8. The AD conversion circuit according to claim 4, wherein the reference signal generation unit is configured to generate a first reference signal and a second reference signal, the first comparison circuit is configured to compare the analog signal with the first reference signal, the second comparison circuit is configured to compare the analog signal with the second reference signal, and the reference signal generation unit is configured to make a timing, at which the first reference signal starts to be increased or decreased, later than a timing at which the second reference signal starts to be increased or decreased, so as to make the first timing later than the second timing.

9. The AD conversion circuit according to claim 5, wherein the first comparison circuit is configured to apply an offset voltage to at least one of a first input terminal to which the analog signal is input and a second input terminal to which the reference signal is input, so as to make the first timing later than the second timing.

10. The AD conversion circuit according to claim 5, wherein the reference signal generation unit is configured to generate a first reference signal and a second reference signal, the first comparison circuit is configured to compare the analog signal with the first reference signal, the second comparison circuit is configured to compare the analog signal with the second reference signal, and the reference signal generation unit is configured to make a timing, at which the first reference signal starts to be increased or decreased, later than a timing at which the second reference signal starts to be increased or decreased, so as to make the first timing later than the second timing.

11. The AD conversion circuit according to claim 6, wherein the first comparison circuit is configured to apply an offset voltage to at least one of a first input terminal to which the analog signal is input and a second input terminal to which the reference signal is input, so as to make the first timing later than the second timing.

12. The AD conversion circuit according to claim 6, wherein the reference signal generation unit is configured to generate a first reference signal and a second reference signal, the first comparison circuit is configured to compare the analog signal with the first reference signal, the second comparison circuit is configured to compare the analog signal with the second reference signal, and the reference signal generation unit is configured to make a timing, at which the first reference signal starts to be increased or decreased, later than a timing at which the second reference signal starts to be increased or decreased, so as to make the first timing later than the second timing.

13. A solid-state image pickup device comprising:

an image capturing unit in which a plurality of pixels including a photoelectric conversion element are arranged in a matrix form to output a pixel signal; and the AD conversion circuit according to claim 1, which receives an analog signal corresponding to the pixel signal, wherein the comparison unit, the latch unit, and the counting unit included in the AD conversion circuit are disposed for each one column or a plurality of columns of arrangement of the pixels of the image capturing unit.

14. A solid-state image pickup device comprising:

an image capturing unit in which a plurality of pixels including a photoelectric conversion element are arranged in a matrix form to output a pixel signal; and the AD conversion circuit according to claim 2, which receives an analog signal corresponding to the pixel signal, wherein the comparison unit, the latch unit, and the counting unit included in the AD conversion circuit are disposed for each one column or a plurality of columns of arrangement of the pixels of the image capturing unit.

* * * * *